(12) United States Patent
Kubo et al.

(10) Patent No.: US 7,885,132 B2
(45) Date of Patent: Feb. 8, 2011

(54) SEMICONDUCTOR MEMORY DEVICE ENHANCING RELIABILITY IN DATA READING

(75) Inventors: Takashi Kubo, Hyogo (JP); Takashi Itoh, Hyogo (JP); Yasuhiro Kashiwazaki, Hyogo (JP); Taku Ogura, Hyogo (JP); Kiyohiro Furutani, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/437,021

(22) Filed: May 7, 2009

(65) Prior Publication Data

US 2009/0213667 A1 Aug. 27, 2009

Related U.S. Application Data

(62) Division of application No. 11/082,926, filed on Mar. 18, 2005, now Pat. No. 7,542,363.

(30) Foreign Application Priority Data

Mar. 29, 2004 (JP) .............................. 2004-095876

(51) Int. Cl.
*G11C 7/04* (2006.01)
(52) U.S. Cl. .............. 365/211; 365/185.23; 365/185.18
(58) Field of Classification Search ................ 365/211, 365/185.23, 185.18
See application file for complete search history.

(56) References Cited

U.S. PATENT DOCUMENTS

| 5,255,233 | A | 10/1993 | Izumi |
| 5,734,275 | A | 3/1998 | Ashmore, Jr. |
| 6,141,277 | A | 10/2000 | Tanzawa |
| 6,240,037 | B1 | 5/2001 | Kuwabara |
| 6,272,051 | B1 | 8/2001 | Choi |
| 6,452,437 | B1 * | 9/2002 | Takeuchi et al. ............ 327/513 |
| 6,482,691 | B2 | 11/2002 | Wu et al. |
| 6,590,813 | B2 | 7/2003 | Shiga |
| 6,842,377 | B2 | 1/2005 | Takano et al. |
| 6,870,766 | B2 | 3/2005 | Cho et al. |

FOREIGN PATENT DOCUMENTS

JP 57-084179 5/1982

(Continued)

OTHER PUBLICATIONS

Japanese Office Action, with English Translation, issued in Japanese Patent Application No. JP 2004-095876, dated Jun. 2, 2009.

(Continued)

*Primary Examiner*—Hoai V Ho
*Assistant Examiner*—Kretelia Graham
(74) *Attorney, Agent, or Firm*—McDermott Will & Emery LLP

(57) ABSTRACT

An internal voltage generating circuit generates and supplies a boosted voltage higher than an internal power supply voltage, as an operating power supply voltage, to a sense amplifier in a read circuit for reading data of a memory cell. A bit line precharge current supplied via an internal data line is produced from the internal power supply voltage. It is possible to provide a nonvolatile semiconductor memory device, which can perform a precise sense operation and an accurate reading of data even under a low power supply voltage condition.

2 Claims, 17 Drawing Sheets

FOREIGN PATENT DOCUMENTS

| | | |
|---|---|---|
| JP | 02-285598 | 11/1990 |
| JP | 4-216397 | 8/1992 |
| JP | 09-245493 | 9/1997 |
| JP | 09-282890 | 10/1997 |
| JP | 11-003598 | 1/1999 |
| JP | 11-073769 | 3/1999 |
| JP | 2001-35177 | 2/2001 |
| JP | 2001-176287 | 6/2001 |
| JP | 2001-307494 | 11/2001 |
| JP | 2002-170391 | 6/2002 |
| JP | 2002-319286 | 10/2002 |
| JP | 2003-217287 | 7/2003 |
| JP | 2003-530656 | 10/2003 |
| WO | WO 01/65561 A1 | 9/2001 |

OTHER PUBLICATIONS

Japanese Notice of Grounds of Rejection, w/ English translation thereof, issued in Japanese Patent Application No. JP 2004-095876 dated Mar. 10, 2009.

* cited by examiner

SEMICONDUCTOR MEMORY DEVICE ENHANCING RELIABILITY IN DATA READING

RELATED APPLICATIONS

This application is a divisional of U.S. application Ser. No. 11/082,926, filed Mar. 18, 2005, now U.S. Pat. No. 7,542,363 which claims priority to Japanese Application No. 2004-095876, filed Mar. 29, 2004, the entire contents of each of which are hereby incorporated by reference.

BACKGROUND OF THE INVENTION

1. Field of the Invention

The present invention relates to a semiconductor memory device, and particularly to a semiconductor memory device, in which a current flowing through a memory cell is compared with a current flowing through a reference cell, to read storage data of the memory cell based on a result of comparison. More particularly, the invention relates to a structure for accurately reading the storage data of a memory cell in a nonvolatile semiconductor memory device.

2. Description of the Background Art

For reducing power consumption and heating, power supply voltages have been lowered in semiconductor integrated circuit devices. Likewise, power supply voltages have been lowered in semiconductor memory devices. In a nonvolatile semiconductor memory device, which is one kind of such semiconductor memory devices, memory cell data is read through the use of a sense amplifier (current sense amplifier) of a current sense type. The current sense amplifier includes a current mirror stage supplying a constant current, and compares a drive current of a selected memory cell with a drive current of a reference cell. The current sense amplifier produces internal data based on a result of this comparison, and thus, the data of the selected memory cell is read out.

In the current sense amplifier, transistors forming the current mirror stage must operate in a saturation region for accurately performing the sensing operation. In the saturation region, a MOS transistor (insulated gate field effect transistor) must satisfy the following relation:

$$Vds \geq Vgs - Vth,$$

where Vds represents a drain-source voltage, Vgs represents a gate-source voltage, and Vth represents a threshold voltage.

If the current mirror stage of the sense amplifier is formed of P-channel MOS transistors, a power supply voltage is supplied to a source, and a voltage corresponding to the comparison result occurs at a drain. As is seen from the above relation, when the power supply voltage is low, MOS transistor is extremely difficult to operate in the saturation region for performing a sensing operation with high accuracy.

P-channel MOS transistor has a gate electrode, which is usually formed of polycrystalline silicon doped with N-type impurities, and the P-channel MOS transistor has a threshold voltage of a large absolute value due to a difference in work function between the gate electrode and a semiconductor substrate. The N-type gate electrode attracts electrons toward a surface of the semiconductor substrate, and works against formation of an inversion layer when a channel is formed. For decreasing the absolute value of the threshold voltage of the P-channel MOS transistor, P-type impurities are implanted into the substrate surface. Therefore, the channel is formed at an inside deeper than the surface of the semiconductor substrate. Such MOS transistor is referred to as a buried channel MOS transistor.

The buried channel is a region doped with impurities of the same conductivity type as the source and drain regions. In the buried channel MOS transistor, since carriers (holes) pass through an inside region of the substrate, mobility is large so that subthreshold characteristics deteriorate when the absolute value of the threshold voltage lowers, resulting in an increased leakage current. Therefore, it is difficult to implement a lower threshold voltage, and the P-channel MOS transistor requires a gate-source voltage of a certain magnitude to be made conductive, and is difficult to operate on a lower supply voltage, as compared to an N-channel MOS transistor. Therefore, when a P-channel MOS transistor is employed in the current mirror stage of a current sense amplifier, such a problem arises that an accurate sensing operation cannot be precisely achieved under a low power supply voltage condition.

A construction for performing the sensing operation with high precision is disclosed in a prior art reference 1 (Japanese Patent Laying-Open No. 4-216397). In the construction disclosed in the prior art reference 1, a sense circuit is configured of a differential amplifier and an offset circuit, and currents of different magnitudes are supplied to a normal bit line of a memory cell array and a reference bit line connected to a reference cell. The prior art reference 1 intends to improve static and dynamic characteristics of a sense amplifier of a current offset type by supplying the offset current.

In such semiconductor memory devices, different amounts of a current flow through a memory cell depending on an operation temperature. For accurately reading memory cell data, it is necessary to read the data by sensing the memory cell current while compensating such temperature characteristics.

A prior art reference 2 (World Patent Publication No. 2003-530656) discloses a construction for compensating for such temperature dependency of the memory cell current due to the difference in operation temperature. This prior art reference 2 discloses a construction for effecting temperature compensation on a word line voltage in an Automatic Program Disturbance Erasure Verify (APDEV) operation of verifying that a leakage current of a predetermined value or greater does not flow through a bit line in a program (write and erase) operation.

A prior art reference 3 (Japanese Patent Laying-Open No. 2003-217287) discloses a construction for compensating for temperature dependency of a memory cell current. In the prior art reference 3, the temperature dependency of the memory cell current is canceled by controlling temperature dependency of a word line voltage and temperature dependency of a discharging time of a bit line, to achieve a threshold voltage distribution of small temperature dependency among memory cells.

A further construction for reducing the temperature dependency of the threshold voltage distribution of the memory cells is disclosed in a prior art reference 4 (Japanese Patent Laying-Open No. 2001-35177). The prior art reference 4 employs a current source generating a temperature-dependent current and a current source producing a constant current independent of a temperature, and adjusts the temperature characteristics in both positive and negative directions by selectively using these current sources.

In the construction disclosed in the prior art reference 1, imbalanced currents are supplied to a normal bit line connected to normal memory cells and a reference bit line connected to reference cells, so that characteristics similar to those of a sense circuit of a load-imbalance type may be achieved to eliminate a restriction on the power supply voltage of the sense circuit of the load-imbalanced type.

In the construction disclosed in the prior art reference 1, however, imbalanced currents are always supplied to the normal bit line and the reference bit line, and it is difficult to supply a load current to only one of the normal and reference bit lines for verifying memory cell characteristics.

The construction disclosed in the prior art 2 utilizes the fact that temperature dependency of a resistance value is different between a P-type resistance element and an N-type resistance element, and is configured to combine selectively the P- and N-type resistance elements for producing a predetermined gradient in the resistance value depending on an operation temperature, to implement temperature compensation of the voltage applied to a word line. In the construction disclosed in the prior art reference 2, it is necessary to adjust adaptively the combination of the P- and N-type resistance elements according to the temperature, to make the temperature control difficult.

In the construction disclosed in the prior art reference 3, a temperature-dependent word line voltage is employed for canceling the temperature dependency of the memory cell current. In the prior art reference 3, however, no consideration is given to the case where the temperature dependency of characteristics is different between the normal memory cell and the reference memory cell.

The construction disclosed in the prior art reference 4 likewise makes the word line voltage temperature-dependent so as to cancel the temperature dependency of the memory cell current, for compensating for temperature dependency of the memory cell currents. In this prior art reference 4, however, no consideration is given to the case where the temperature dependency of the drive current is different between the normal memory cell and the reference memory cell.

Further, in the prior art references 1 to 4, no consideration is given to the configuration and sensing operation of the sense amplifier for achieving a highly precise sensing of memory cell current even under a low power supply voltage condition.

SUMMARY OF THE INVENTION

An object of the invention is to provide a semiconductor memory device, which can accurately read memory cell data even with a low power supply voltage.

Another object of the invention is to provide a semiconductor memory device containing a current sense amplifier that can read multi-level data with high precision.

A further object of the invention is to provide a nonvolatile semiconductor memory device, which can accurately read memory cell data without suffering from an operation environment.

A semiconductor memory device according to a first aspect of the invention includes a plurality of memory cells; and a sense amplifier circuit for sensing data of a memory cell selected from the plurality of memory cells. The sense amplifier circuit includes a boosted power supply node receiving a voltage higher than an internal power supply voltage, a read section coupled to the boosted power supply node in operation, and reading storage data of the selected memory cell according to a current flowing through the memory cell, and a precharge stage coupled to a node receiving the internal power supply voltage, supplying a current received from the internal power supply node to the selected memory cell in response to a precharge instructing signal, and precharging a data line connected to the selected memory cell to a predetermined potential.

A semiconductor memory device according to a second aspect of the invention includes a plurality of memory cells each formed of a transistor having a gate and storing data by a threshold voltage of the transistor; a reference cell having the same structure as the memory cells; a sense amplifier circuit sensing a drive current of a memory cell selected from the plurality of memory cells and a drive current of the reference cell, to read the data of the selected memory cell; and a gate voltage generating circuit producing voltages to be applied to the gates of the reference cell and the selected memory cell. The gate voltage generating circuit produces voltages at the same level for application to the gates of the reference cell and the selected memory cell during a normal mode of data reading from the selected memory cell, and produces, as a gate voltage of the selected memory cell, a voltage at a level different from the level in the normal mode for a memory cell positioned around an upper or lower end of a drive current distribution range of the memory cells in a verification mode of verifying the writing or erasing of the selected memory cell.

A semiconductor memory device according to a third aspect of the invention includes a plurality of memory cells; a reference memory cell; and a sense amplifier having a first node connected to the memory cell selected from the plurality of memory cells and a second node connected to the reference cell, and reading data from the selected memory cell according to currents flowing through the first and second nodes. The first node has a larger capacitance value than the second node has.

A semiconductor memory device according to a fourth aspect of the invention includes a sense amplifier circuit having a first node connected to a selected memory cell and a second node connected to a reference cell, and reading data of the selected memory cell according to currents flowing through the first and second nodes; and first and second constant current sources coupled to the first and second nodes, and driving, when activated, driving constant currents from the first and second nodes, respectively. These first and second constant current sources can be activated individually and separately.

A semiconductor memory device according to a fifth aspect of the invention includes memory cells, arranged at least in one row, each including a transistor having a gate and exhibiting temperature-dependent gate-voltage/drive-current characteristics, and storing data according to a threshold voltage of the transistor; a voltage generating circuit generating a word line drive voltage having temperature dependency compensating for the temperature dependency of the gate-voltage/drive-current characteristics of the transistors of the memory cells; at least one word line arranged corresponding to the memory cells arranged in the row, and connected to the gates of the memory cell transistors; and a word line select circuit for transmitting a word line drive voltage generated by the voltage generating circuit to the one word line when the one word line is selected. The word line drive voltage generated by the voltage generating circuit can selectively have positive temperature dependency and negative temperature dependency according to a control signal.

According to the semiconductor memory device of the first aspect, a voltage higher than an internal power supply voltage is supplied as a power supply voltage of the sense amplifier circuit. Therefore, even when the internal power supply voltage is low, transistors forming the read section can operate in a saturation region, to perform a stable sensing operation.

According to the semiconductor memory device of the second aspect, when the memory cell in the upper or lower end region of the drive current distribution range of the memory cells is to be verified, the gate voltage thereof is set to the voltage level different from that in the normal operation mode so that the threshold voltage distribution of the memory cells can be precisely controlled, and the data reading can be accurately performed even in the case of storage of multi-level data.

According to the semiconductor memory device of the third aspect, the capacitance value of the second node connected to the reference cell is smaller than that of the first node connected to the normal memory cell. This imbalance between the capacitance values can cause rapid convergence of the voltages on the sense nodes to the predetermined voltage level, resulting in a reduced access time.

According to the semiconductor memory device of the fourth aspect of the invention, the constant current sources, which drive the constant current when made active, are connected to the sense nodes coupled to the reference cell and the normal cell, and the current characteristics of the normal cell and the reference cell can be verified independently of each other.

According to the semiconductor memory device of the fifth aspect of the invention, the word line drive voltage is generated having the temperature dependency, which compensates for the temperature dependency of the characteristics between the gate voltage and drive current of the memory cell transistor, and the word line drive voltage can have the positive temperature dependency and the negative temperature dependency selectively by the control signal. Thus, the word line drive voltage can be set to an optimum level depending on the operation temperature, and the temperature dependency of the current flowing through the memory cell transistor can be compensated for. Thus, even in the case where the reference memory cell and the memory cell are different in temperature dependency of the threshold voltage, the memory cell current can be produced with no temperature dependency, resulting in an accurate sensing operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
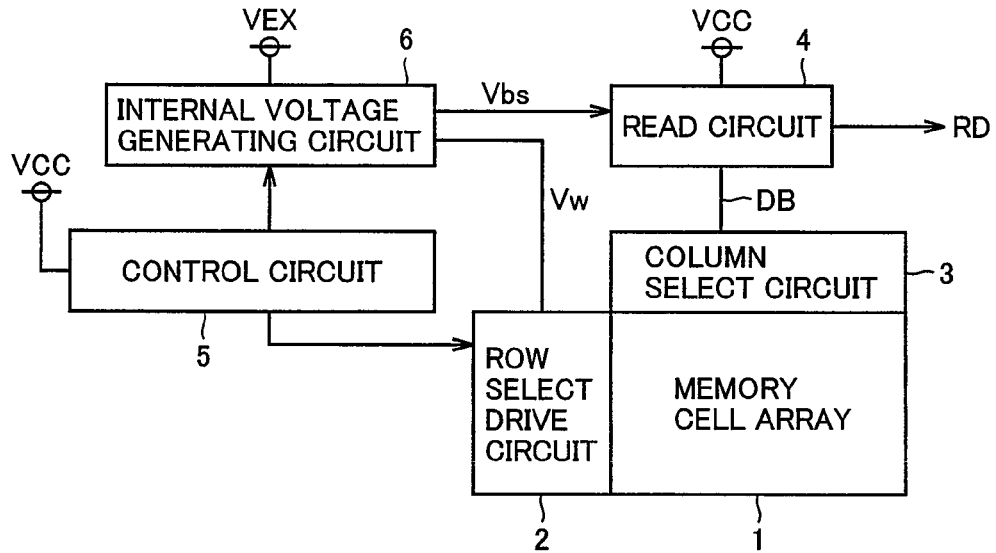
FIG. 1 schematically shows a whole construction of a nonvolatile semiconductor memory device according to the invention.

FIG. 1 schematically shows a construction of a main portion of a nonvolatile semiconductor memory device according to a first embodiment of the invention. Referring to FIG. 1, the nonvolatile semiconductor memory device according to the first embodiment of the invention includes a memory cell array 1 having nonvolatile memory cells arranged in rows and columns. In memory cell array 1, word lines are arranged corresponding to memory cell rows, and bit lines are arranged corresponding to memory cell columns. In FIG. 1, however, these word lines and bit lines are not shown for the sake of simplification of the figure.

The nonvolatile semiconductor memory device includes a row select drive circuit 2 for selecting an addressed row and driving a word line on a selected row to a predetermined voltage, a column select circuit 3 for selecting a column (bit line) in memory cell array 1, a read circuit 4 for reading data of the memory cell in the column selected by column select circuit 3, a control circuit 5 for controlling various internal operations of the nonvolatile semiconductor memory device, and an internal voltage generating circuit 6 for producing an internal voltage Vw required for writing, erasing and reading of data, and for supplying a boosted voltage Vbs to read circuit 4 under the control of control circuit 5.

Control circuit 5 receives an internal power supply voltage VCC as an operation power supply voltage, and internal voltage generating circuit 6 receives an externally applied power supply voltage VEX as an operation power supply voltage. External power supply voltage VEX may be at the same voltage level as internal power supply voltage VCC, or may be different therefrom. Read circuit 4 receives internal power supply voltage VCC.

Memory cell array 1 includes normal memory cells, which will be referred to as "memory cells" hereinafter, for storing data as well as reference cells supplying a reference current in an operation of reading data from a selected memory cell. In the data read operation, read circuit 4 compares drive currents of the selected memory cell and the reference cell with each other, and produces read data RD based on a result of comparison.

Column select circuit 3 includes a column address decoder for decoding a column address signal, and a column select gate for connecting the bit line in a selected column to read circuit 4 according to a column select signal (and a block select signal) from the column address decoder.

The control circuit 5 is formed of, e.g., a command decoder, and produces various operation control signals according to an externally applied operation mode command. In FIG. 1, control circuit 5 is shown controlling operations of internal voltage generating circuit 6 and row select drive circuit 2, but control circuit 5 also controls a data read operation in read circuit 4 as well as an operation of and an applied voltage level of a column address decode circuit included in column select circuit 3.

Figure 2:
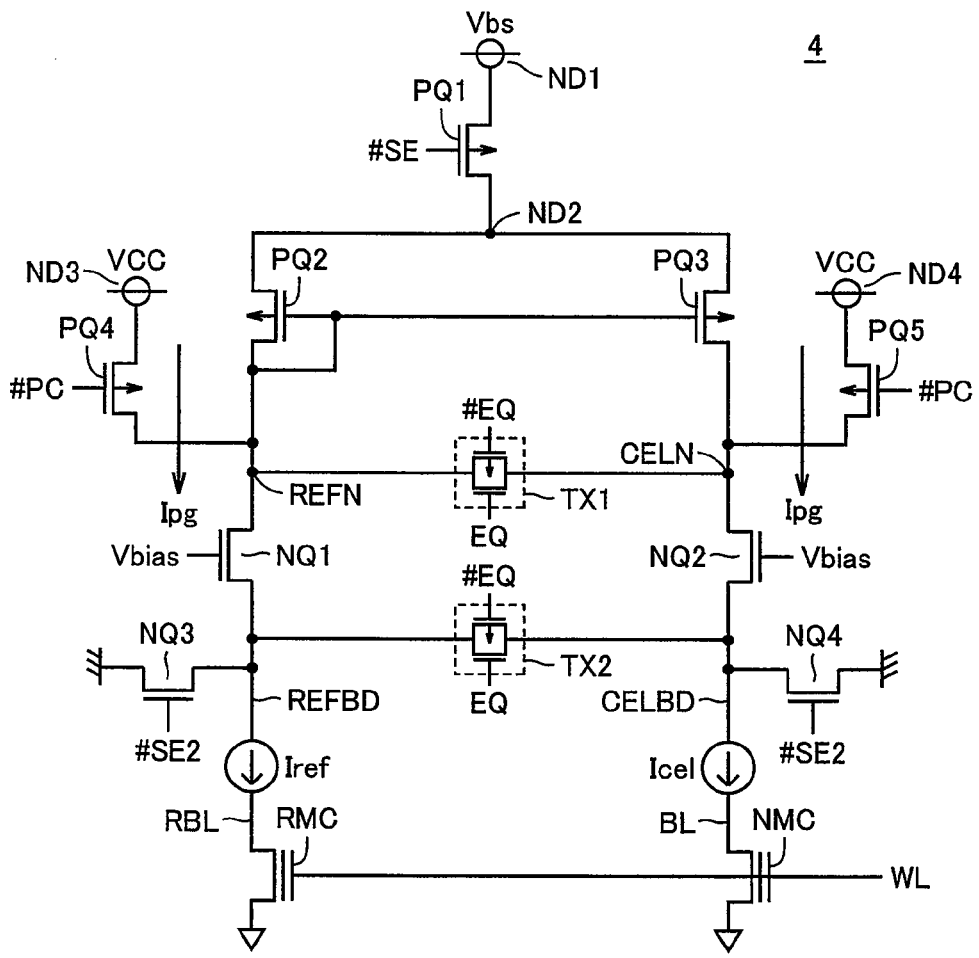
FIG. 2 shows by way of example a configuration of a sense amplifier included in a read circuit shown in FIG. 1.

FIG. 2 shows an example of a configuration of a sense amplifier (sense amplifier circuit) included in read circuit 4 shown in FIG. 1. In FIG. 2, the sense amplifier includes a P-channel MOS transistor PQ1 connected between a boosted power supply node ND1 and an internal node ND2 and having a gate receiving a sense activating signal #SE, a P-channel MOS transistor PQ2 connected between an internal node ND2 and an internal node REFN and having a gate connected to internal node REFN, a P-channel MOS transistor PQ3 connected between internal nodes ND2 and CELN and having a gate connected to internal node REFN, a P-channel MOS transistor PQ4 made conductive to supply a precharge current Ipg from an internal power supply node ND3 to internal node REFN when a precharge instructing signal #PC is active, and a P-channel MOS transistor PQ5 made conductive to supply precharge current Ipg from internal power supply node ND4 to internal node CELN when precharge instructing signal #PC is active.

Power supply nodes ND3 and ND4 are supplied with an internal power supply voltage VCC. Boosted power supply node ND1 is supplied with boosted voltage Vbs higher than internal power supply voltage VCC. Precharge current Ipg is produced from internal power supply voltage VCC. Boosted voltage Vbs is utilized only in the sensing operation of the sense amplifier. Consequently, current consumption of the circuit generating boosted voltage Vbs is reduced, to suppress an increase of the current consumption.

P-channel MOS transistors PQ1-PQ5 are each of a normal buried channel type, as will be described later.

The sense amplifier includes an N-channel MOS transistor NQ1 connected between internal node REFN and an internal read data line REFBD and having a gate receiving a constant bias voltage Vbias, an N-channel MOS transistor NQ2 connected between internal node CELN and an internal read data line (sense node) CELBD and having a gate receiving bias voltage Vbias, an N-channel MOS transistor NQ3 made conductive to maintain a reference data line REFBD at the ground voltage level when a sense amplifier activating signal #SE2 is inactive, an N-channel MOS transistor NQ4 made conductive to maintain internal read data line CELBD at the ground voltage level when sense amplifier activating signal #SE2 is inactive, a CMOS transmission gate TX1 made conductive to short-circuit internal nodes REFN and CELN when complementary equalize instructing signals EQ and #EQ are active, and a CMOS transmission gate TX2 made conductive to short-circuit reference data line REFBD and internal read data line CELBD when complementary equalize instructing signals EQ and #EQ are active.

In a data read operation, reference data line REFBD is connected to a reference cell RMC via a reference bit line RBL, and internal read data line CELBD is connected to a memory cell (normal memory cell) NMC via a bit line BL. Gates of these reference cell RMC and memory cell NMC are commonly connected to a word line WL. FIG. 2 does not show a column select gate included in column select circuit 3, for selecting a memory cell and a reference cell.

Figure 3:
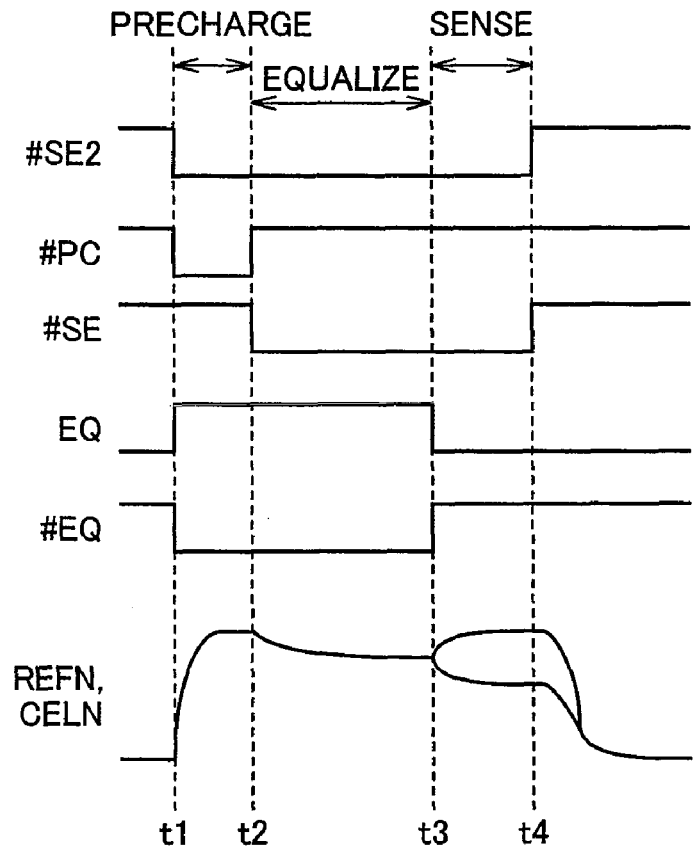
FIG. 3 is a timing chart representing an operation of the sense amplifier shown in FIG. 2.

FIG. 3 is a timing chart representing an operation of a sense amplifier shown in FIG. 2. An operation of the sense amplifier shown in FIG. 2 will now be described with reference to the timing chart of FIG. 3.

Before time t1, the sense amplifier is inactive, and sense amplifier activating signal #SE2, precharge instructing signal #PC, sense activating signal #SE and equalize instructing signal #EQ are at the H level (logically high level), and equalize instructing signal EQ is at the L level (logically low level). In this state, P-channel MOS transistor PQ1 is non-conductive, and internal node ND2 is in a floating state. P-channel MOS transistors PQ4 and PQ5 are also non-conductive. N-channel MOS transistors NQ3 and NQ4 are conductive, and reference data line REFBD and internal read data line CELBD are held at the ground voltage level. CMOS transmission gates TX1 and TX2 are conductive, and internal nodes REFN and CELN are electrically short-circuited. Reference data line REFBD and internal read data line CELBD are electrically short-circuited and are held at the same potential.

At time t1, an operation of reading internal data starts. At time t1, equalize instructing signal EQ and complementary equalize instructing signal #EQ attain the H and L levels, respectively, and CMOS transmission gates TX1 and TX2 turn non-conductive, so that the equalization of the internal nodes is completed. Also, sense amplifier activating signal #SE2 attains the L level, and N-channel MOS transistors NQ3 and NQ4 are turned off (turn non-conductive), so that the precharging of data lines REFBD and CELBD to the ground potential level is completed.

Further, at time t1, precharge instructing signal #PC attains the L level, and P-channel MOS transistors PQ4 and PQ5 are turned on (turn conductive), so that precharge current Ipg is supplied to reference data line REFBD and internal read data line CELBD. Reference data line REFBD and internal read data line CELBD are coupled to reference cell RMC and selected memory cell NMC via column select gates (not shown), respectively, and precharge current Ipg is supplied to reference bit line RBL and bit line BL.

N-channel MOS transistors NQ1 and NQ2 receiving bias voltage Vbias on their gates operate in a source follower mode, and the voltage levels of reference data line REFBD and internal read data line CELBD are held at a constant voltage level of (Vbias−VTHN), where VTHN is a threshold voltage of the N-channel MOS transistor. Internal nodes REFN and CELN are charged with precharge current Ipg up to the level of internal power supply voltage VCC. Internal nodes REFN and CELN are capacitively isolated by MOS transistors NQ1 and NQ2 from data lines REFBD and CELBD, and thus are not affected by variation in potential level of data lines REFBD and CELBD.

At time t2, precharge instructing signal #PC attains the H level, and MOS transistors PQ4 and PQ5 are turned off so that the precharging of internal nodes REFN and CELN as well as precharging of reference bit line RBL and bit line BL to the predetermined potential are completed.

At time t2, sense activating signal #SE attains the L level, and P-channel MOS transistor PQ1 is turned on so that the sense amplifier turns active, and P-channel MOS transistors PQ2 and PQ3 supply the currents from boosted node ND1. MOS transistors PQ2 and PQ3 form a current mirror stage with MOS transistor PQ2 being a master, and supply the currents of the same magnitude.

At this time instant, equalize instructing signals EQ and #EQ are still at the H and L levels, respectively, and CMOS transmission gates TX1 and TX2 are in an on state. Therefore, the voltage levels of internal nodes REFN and CELN lower according to drive currents Iref and Icel of reference cell RMC and memory cell NMC, respectively, while maintaining the same voltage level with each other.

At time t3, equalize instructing signals EQ and #EQ attain the L and H levels, respectively, and CMOS transmission gates TX1 and TX2 are turned off. At this time instant, the voltages on internal nodes REFN and CELN are already dropped to a sufficiently low level, so that MOS transistors PQ2 and PQ3 operate satisfactorily in a saturation region, and supply, through the current mirror operation, the current, which is of the same magnitude as reference current Iref supplied to reference cell RMC, to internal node CELN. According to a difference between reference current Iref and drive current Icel of memory cell NMC, a potential difference rapidly occurs between internal nodes CELN and REFN.

At time t4, both sense activating signal #SE and sense amplifier activating signal #SE2 attain the H level, P-channel MOS transistor PQ1 is turned off, and MOS transistors NQ3 and NQ4 are turned on. Accordingly, the sensing operation is completed, and data lines REFBD and CELBD are pre-charged to the ground voltage level again. In response to data lines REFBD and CELBD being driven to the ground voltage level, internal nodes REFN and CELN are discharged to the ground voltage level via MOS transistors NQ1 and NQ2, and are precharged to the ground voltage level.

Through the use of CMOS transmission gates TX1 and TX2 for supplying reference current Iref and cell current Icel while equalizing internal nodes REFN and CELN in the sense operation, P-channel MOS transistors PQ2 and PQ3 forming the current mirror stage for the drive current of memory cell NMC can operate sufficiently in a saturation region, and the sense operation can be performed in the most sensitive region at high speed.

The potential changes of internal nodes REFN and CELN are not transmitted to internal data lines REFBD and CELBD owing to the function of MOS transistors NQ1 and NQ2. Thus, MOS transistors NQ1 and NQ2 capacitively or capacitance-wise isolate internal nodes REFN and CELN from data lines REFBD and CELBD, so that the potentials on internal nodes CELN and REFN can be rapidly changed according to the magnitudes of cell current Icel and reference current Iref, respectively.

Figure 4:
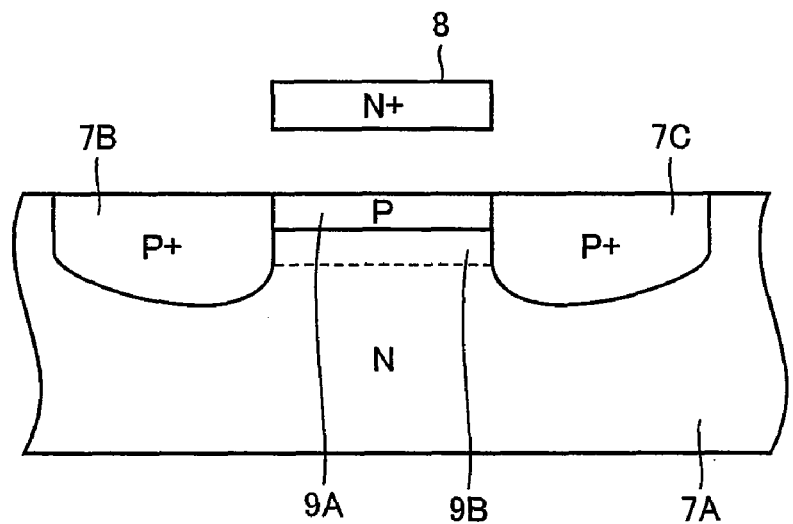
FIG. 4 schematically shows a sectional structure of a P-channel MOS transistor included in a sense amplifier shown in FIG. 2.

FIG. 4 schematically shows a cross-sectional structure of a P-channel MOS transistor included in the sense amplifier shown in FIG. 2. In FIG. 4, the P-channel MOS transistor includes an N-type semiconductor substrate region (e.g., a well or substrate) 7A, P-type impurity regions 7B and 7C formed being spaced apart from each other at a surface of semiconductor substrate region 7A, a P-type impurity doped layer 9A formed at the surface of the substrate region between impurity regions 7B and 7C, and a gate electrode 8 formed above on impurity doped layer 9A with a gate insulating film (not shown) in between. Gate electrode 8 is usually formed of polycrystalline silicon doped with N-type impurities.

In the P-channel MOS transistor shown in FIG. 4, gate electrode 8 is an N-type semiconductor, and electrons at the surface of semiconductor substrate region 7A move toward gate electrode layer 8. For canceling the influence of the electrons at the surface of semiconductor substrate region 7A, P-type impurity doped layer 9A is provided. A channel region 9B is formed below P-type impurity doped layer 9A, and forms a buried channel. For this buried channel 9B, when a voltage lower than the voltage on the source region (impurity region 7B or 7C) is applied to gate electrode 8, the electrons move downward or inward from the surface of semiconductor substrate region 7A to expand a depletion layer, so that an inversion layer is formed in buried channel region 9B, and the P-channel MOS transistor is turned on.

In the P-channel MOS transistor of the buried channel type shown in FIG. 4, P-type impurity doped layer 9A is provided to cause an off-leak current flow, so that the absolute value of the threshold voltage cannot be made large sufficiently. In addition, the absolute value of the threshold voltage is larger than that of the NMOS transistor, the majority carriers are holes of a large mass, and thus, the current driving capability is smaller than that of an N-channel MOS transistor. When using a P-channel MOS transistor, therefore, there are taken measures of increasing a channel width to increase the current drive capability. However, by using boosted voltage Vbs, it is possible to operate P-channel MOS transistors PQ2 and PQ3 forming the current mirror stage and P-channel MOS transistor PQ1 in a saturation region and to increase the current driving capability during the sense amplifier operation even if internal power supply voltage VCC is low. Thereby, the P-channel MOS transistors forming the current mirror stage in the sense amplifier can stably drive the current of the magnitude defined by square characteristics according to the gate voltage, and the sense operation can be accurately performed.

The dual gate process is not required, in which polycrystalline silicon doped with N-type impurities is used for the gate electrode of an N-channel MOS transistor, and, polycrystalline silicon doped with P-type impurities is used for the gate electrode of a P-channel MOS transistor. Consequently, the manufacturing steps can be simplified.

[Modification]

Figure 5:
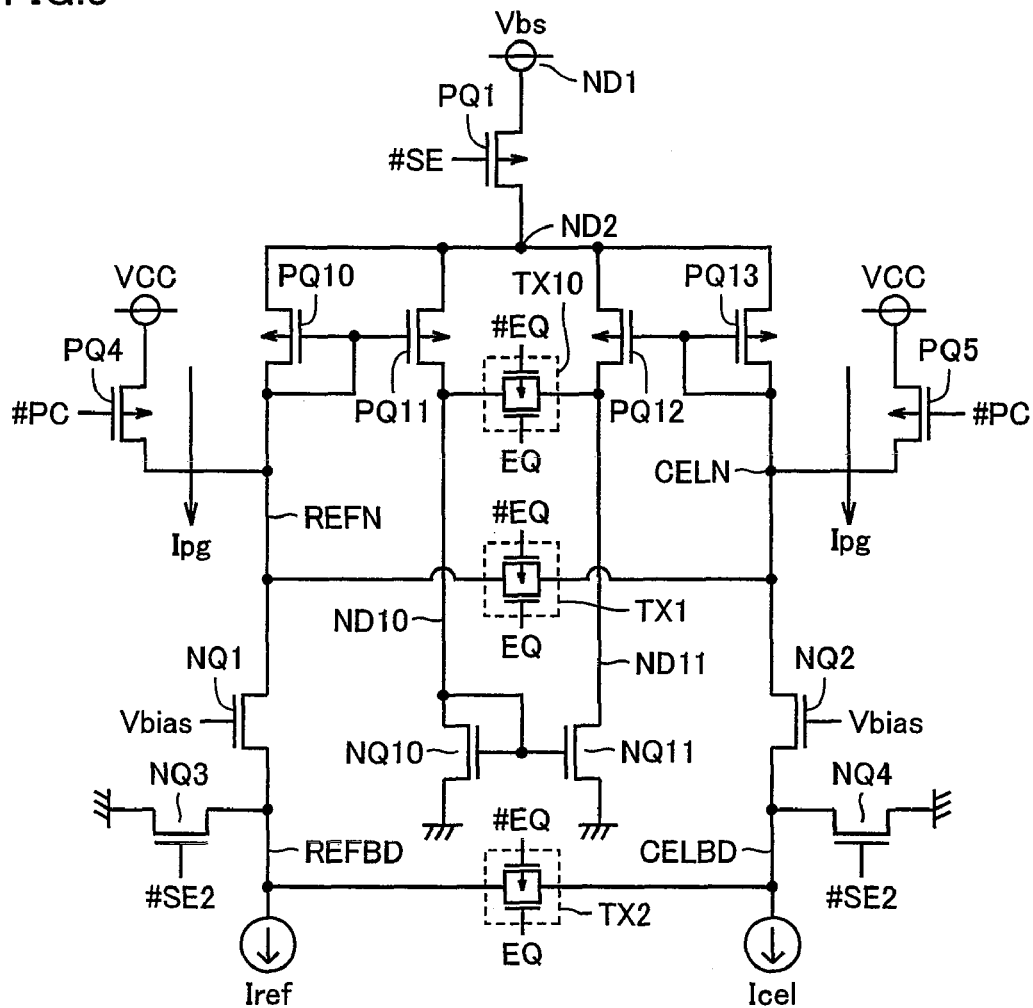
FIG. 5 shows a modification of the sense amplifier included in the read circuit shown in FIG. 1.

FIG. 5 shows a configuration of a modification of the sense amplifier according to the first embodiment of the invention. In FIG. 5, the sense amplifier includes a P-channel MOS transistor PQ10 connected between internal nodes ND1 and REFN and having a gate connected to internal node REFN, a P-channel MOS transistor PQ11 connected between internal nodes ND1 and ND10 and having a gate connected to internal node REFN, a P-channel MOS transistor PQ12 connected between internal nodes ND1 and ND11 and having a gate connected to internal node CELN, a P-channel MOS transistor PQ13 connected between internal nodes ND1 and CELN and having a gate connected to internal node CELN, a CMOS transmission gate TX10 for electrically short-circuiting internal nodes ND10 and ND11 according to complementary equalize instructing signals EQ and #EQ, an N-channel MOS transistor NQ11 connected between the internal node and the ground node and having a gate connected to internal node ND10, and an N-channel MOS transistor NQ11 connected between internal node ND11 and the ground node and having a gate connected to internal node ND10.

Other construction of the sense amplifier in FIG. 5 is the same as that of the sense amplifier in FIG. 2. Corresponding components are allotted with the same reference numerals, and description thereof will not be repeated.

P-channel MOS transistors PQ4, PQ5 and PQ10-PQ13 are all of the buried channel type. P-channel MOS transistors PQ10 and PQ11 form the current mirror stage, N-channel MOS transistors NQ10 and NQ11 form the current mirror stage, and P-channel MOS transistors PQ12 and PQ13 form the current mirror stage.

The operation of the sense amplifier shown in FIG. 5 is also represented by the timing chart of FIG. 3. While maintaining internal nodes REFN and CELN at the same potential, reference current Iref and cell current Icel flow in the sense operation. MOS transistors PQ10 and PQ11 cooperate to supply a current of the same magnitude as reference current Iref to node ND10, and MOS transistors NQ10 and NQ11 drive a current of the same magnitude from nodes ND10 and ND11.

MOS transistors PQ12 and PQ13 form a current mirror stage, and cooperate to supply a current of the same magnitude as cell current Icel to internal node ND11. In the sense operation after completion of equalization, therefore, a potential difference according to the magnitudes of reference current Iref and cell current Icel occurs between internal nodes ND10 and ND11. Accordingly, by outputting the potential of internal node ND11 or ND10 as internal read data, the memory cell data can be read at high speed.

In the configuration of the sense amplifier shown in FIG. 5, a potential difference between reference current Iref and cell current Icel occurs between internal nodes ND10 and ND11. Therefore, it is possible to suppress an influence of capacitances of internal nodes REFN and CELN in memory cell data reading, and the memory cell data can be read fast and precisely.

In the sense amplifier shown in FIG. 5 also, boosted voltage Vbs higher than internal power supply voltage VCC is supplied to boosted power supply node ND1, so that MOS transistors PQ10-PQ13, NQ10 and NQ11 forming the current mirror stages can be made operating in the saturation region. Accordingly, the current sense of the memory cell data can be performed fast to produce the internal read data through the current mirror operation.

According to the first embodiment of the invention, as described above, since the boosted voltage higher than the internal power supply voltage is used as the power supply voltage of the sense amplifier for reading memory cell data, the transistors forming the current mirror stage can reliably operate in the saturation region even with the low power supply voltage, and thus the sense operation can be performed precisely.

The internal power supply voltage is used for precharging the reference bit line and the bit line, and the boosted voltage is used only for the sense operation so that the power consumed for producing the boosted voltage can be reduced.

Second Embodiment

Figure 6:
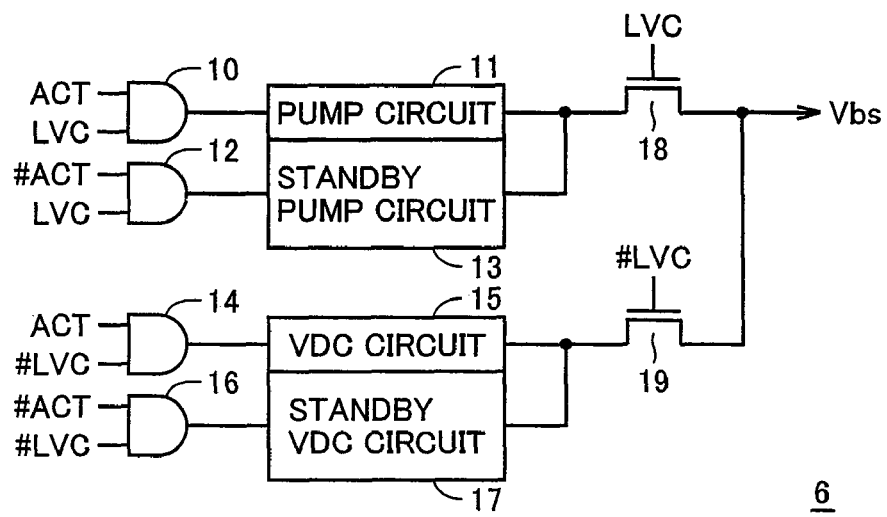
FIG. 6 schematically shows a construction of an internal voltage generating circuit according to a second embodiment of the invention.

FIG. 6 schematically shows a construction of a portion for generating boosted voltage Vbs supplied to the sense amplifier in the first embodiment. A boosted voltage generating portion shown in FIG. 6 is included in internal voltage generating circuit 6 shown in FIG. 1.

In FIG. 6, the boosted voltage generating unit includes an AND circuit 10 receiving an operation mode instructing signal ACT and a low-voltage instructing signal LVC, a pump circuit 11 selectively activated in response to the output signal of AND circuit 10, to produce a boosted voltage by the charge pump operation when made active, an AND circuit 12 receiving a complementary operation mode instructing signal #ACT and low-voltage instructing signal LVC, a standby pump circuit 13, which is activated according to the output signal of AND circuit 12, and produces a boosted voltage by the charge pump operation when it is active, an AND circuit 14 receiving operation mode instructing signal ACT and a complementary low-voltage instructing signal #LVC, an internal Voltage Down Converter circuit (internal VDC circuit) 15 for generating a down-converted voltage through down conversion of an external power supply voltage when the output signal of AND circuit 14 is active, an AND circuit 16 receiving complementary operation mode instructing signal #ACT and complementary low-voltage instructing signal #LVC, a standby VDC circuit 17 selectively activated according to the output signal of AND circuit 16 and down-converting the external power supply voltage, a transfer gate 18 rendered conductive when low-voltage instructing signal LVC is active, to transfer the output voltages of pump circuit 11 and standby pump circuit 13 as sense boosted voltage Vbs, and a transfer gate 19 rendered conductive when complementary low-voltage instructing signal #LVC is inactive, to transfers the voltages produced by VDC circuit 15 and standby VDC circuit 17 as sense boosted voltage Vbs.

FIG. 6 shows by way of example the construction, in which each of transfer gates 18 and 19 is formed of an N-channel MOS transistor. These transfer gates 18 and 19 each may be formed of a CMOS transmission gate or a voltage follower.

Operation mode instructing signal ACT turns active when the nonvolatile semiconductor memory device is accessed, and is held at the H level during the operation cycle. Complementary operation mode instructing signal ACT turns active when the nonvolatile semiconductor memory device is in the standby state.

Low voltage instructing signal LVC turns active or is set to the H level when external power supply voltage (VEX) is 1.8

V, and boosted voltage Vbs is 2.5 V. Complementary low-voltage instructing signal #LVC is set to the H level when external power supply voltage (VEX) is 3.3 V, and boosted voltage Vbs is 2.5 V.

Therefore, when the external power supply voltage is, e.g., 1.8 V, and boosted voltage Vbs is higher than the external power supply voltage, VDC circuit 15 and standby VDC circuit 17 are always kept inactive. Pump circuit 11 and standby pump circuit 13 are made active during the active cycle and the standby cycle of this nonvolatile semiconductor memory device, respectively, and perform the boosting operation to produce boosted voltage Vbs when activated. Transfer gate 18 is made conductive to transmit the output voltages of pump circuit 11 and standby pump circuit 13 as the boosted voltage in the low voltage condition.

When the external power supply voltage is 3.3 V higher than boosted voltage Vbs, low-voltage instructing signal LVC is set to the L level, and complementary low-voltage instructing signal #LVC is set to the H level. In this state, pump circuit 11 and standby pump circuit 13 are kept inactive because the output signals of AND circuits 10 and 12 are always at the L level. Also, transfer gate 18 is kept non-conductive. Since transfer gate 19 is made conductive, VDC circuit 15 and standby VDC circuit 17 turn active according to the output signals of AND circuits 14 and 16 during the active cycle and the standby cycle of the nonvolatile semiconductor memory device, respectively, to perform the voltage down-conversion to produce the internal voltage of 2.5 V for sense boosted voltage Vbs.

Figure 7:
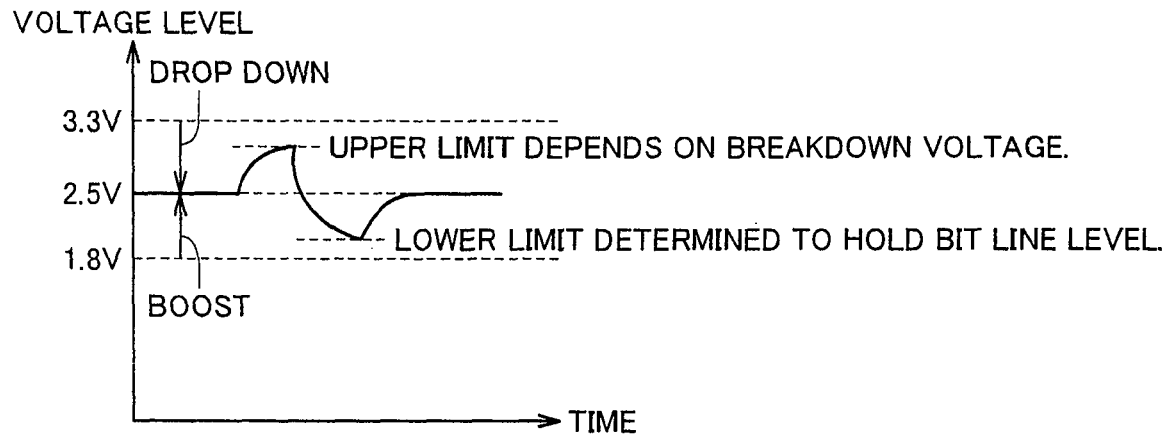
FIG. 7 schematically shows a range of controlled change of a generated voltage of an internal voltage generating circuit shown in FIG. 6.

FIG. 7 schematically shows an allowable voltage change range of boosted voltage Vbs. When boosted voltage Vbs is produced by pump circuit 11 and standby pump circuit 13 which boost the external power supply voltage, a ripple occurs in boosted voltage Vbs due to the pumping operation. In this case, the upper limit value of boosted voltage Vbs is determined by a breakdown voltage (considering a duty) of the MOS transistor using this boosted voltage Vbs. The lower limit value of boosted voltage Vbs is set to the voltage level capable of maintaining, for a require period, a voltage level required for the read voltage applied to the drain of a memory cell via the bit line in the sensing operation. In this case, the lower limit voltage level of the boosted voltage depends on the voltage level of bias voltage Vbias. The number of pumps in pump circuit 11 and standby pump circuit 13, the accuracy of the level sense, the response speed and decoupling capacitance value are set to satisfy the conditions of the upper and lower limit values as described above.

Figure 8:
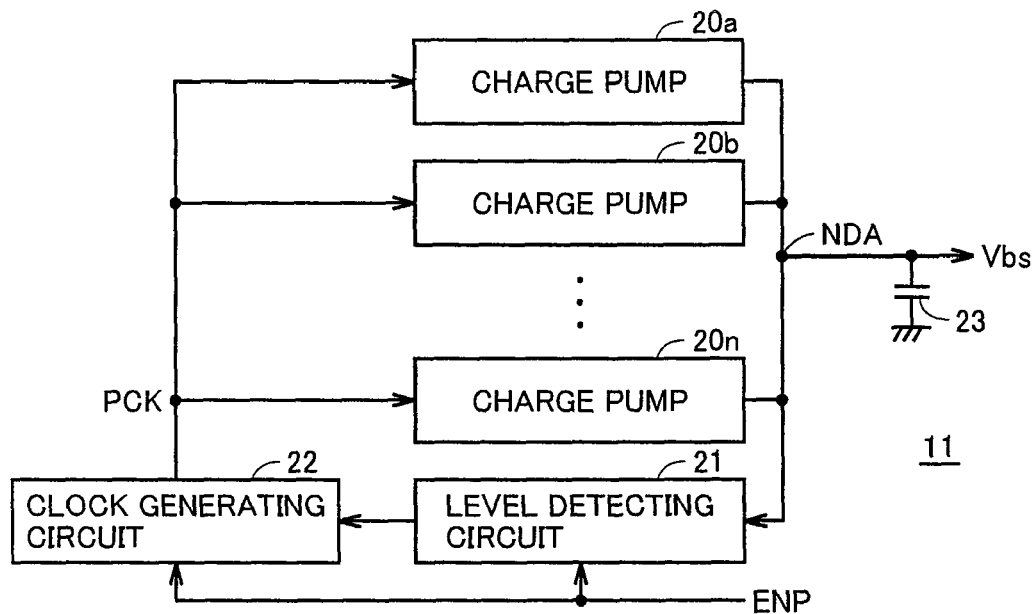
FIG. 8 schematically shows a construction of a pump circuit shown in FIG. 6.

FIG. 8 schematically shows an example of a construction of pump circuit 11. In FIG. 8, pump circuit 11 includes charge pumps 20a-20n arranged in parallel, a level detecting circuit 21 for detecting the voltage level of boosted voltage Vbs generated at an output node NDA, and a clock generating circuit 22 selectively activated according to the output signal of level detecting circuit 21 and producing a pump clock signal PCK when made active. A decouple capacitance 23 is connected to output node NDA, and stabilizes boosted voltage Vbs.

Level detecting circuit 21 and clock generating circuit 22 are supplied with an enable signal ENP from AND circuit 10 shown in FIG. 6, and operate when enable signal ENP is active. While enable signal ENP is active, level detecting circuit 21 stops the clock generating operation of clock generating circuit 22 when boosted voltage Vbs attains a predetermined voltage level or higher and causes clock generating circuit 22 to generate pump clock signal PCK when boosted voltage Vbs becomes lower than the predetermined voltage level.

Clock generating circuit 22 is formed of, e.g., a ring oscillator, and produces pump clock signal PCK having a predetermined period when the output signal of level detecting circuit 21 and enable signal ENP are both active.

Charge pumps 20a-20n perform the charge pump operation by capacitance elements according to pump clock signal PCK, and supply charges to output node NDA to produce boosted voltage Vbs.

The detection accuracy and response speed of level detecting circuit 21 as well as the capacitance value of decouple capacitance 23 and the number of charge pumps 20a-20n are determined to satisfy the upper and lower limit values of the boosted voltage shown in FIG. 7.

Figure 9:
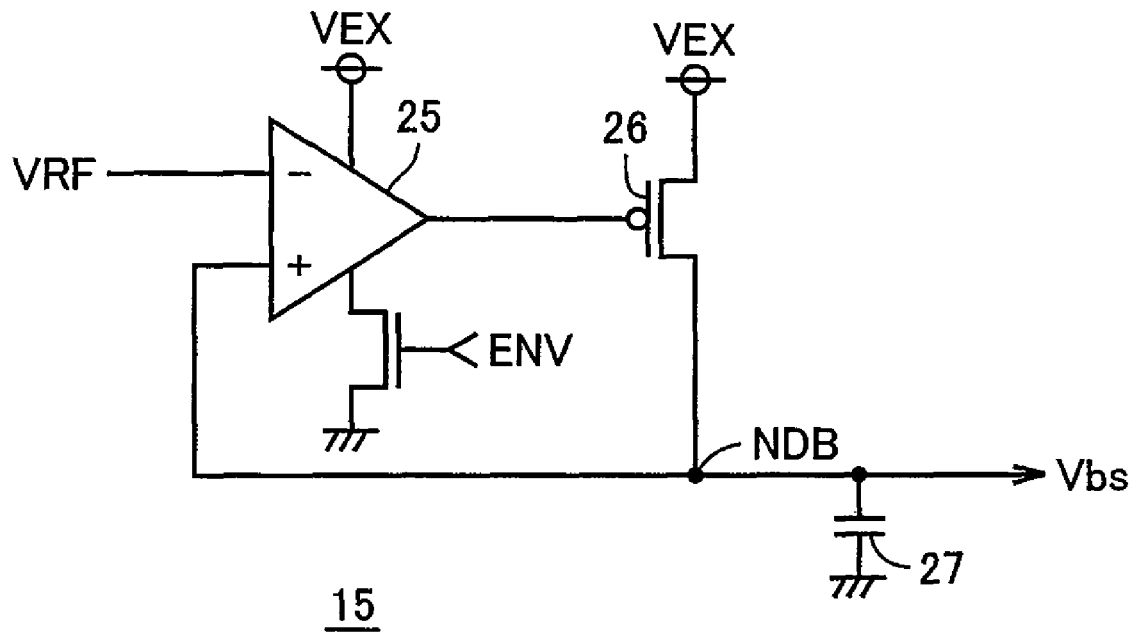
FIG. 9 schematically shows an example of a construction of a VDC circuit shown in FIG. 6.

FIG. 9 schematically shows an example of a construction of VDC circuit 15 shown in FIG. 6. In FIG. 9, VDC circuit 15 includes a comparing circuit 25 for comparing voltage Vbs on an output node NDB with a reference voltage VRF, a current drive transistor 26 for supplying a current from an external supply node to output node NDB according to an output signal of comparing circuit 25, and a decouple capacitance 27 for stabilizing the voltage on output node NDB.

Comparing circuit 25 is selectively activated according to an output signal (enable signal) ENV of AND circuit 14 shown in FIG. 6. Comparing circuit 25, when made active, compares voltage Vbs on output node NDB with reference voltage VRF, and turns off current drive transistor 26 when voltage Vbs is higher than reference voltage VRF. When voltage Vbs is lower than reference voltage VRF, comparing circuit 25 increases the conductance of current drive transistor 26 to supply the current from the external power supply node to output node NDB, to raise the voltage level of voltage Vbs.

Response characteristics of the feedback loop of current drive transistor 26, output node NDB and comparing circuit 25 as well as the comparison accuracy of comparing circuit 25 and the capacitance value of decouple capacitance 27 are set to appropriate values so that the ripple in sense boosted power supply voltage Vbs can be restricted within a range between the upper and lower limit values shown in FIG. 7.

Figure 10:
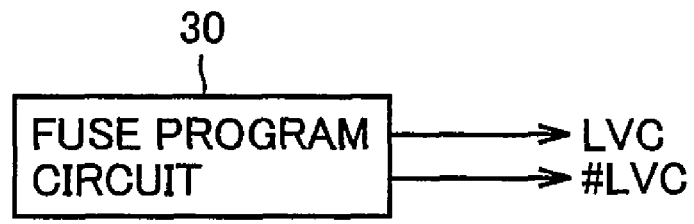
FIG. 10 schematically shows an example of a construction of a portion generating a low-voltage indication signal shown in FIG. 6.

FIG. 10 shows an example of a construction of a portion generating low-voltage instructing signals LVC and #LVC. In FIG. 10, a fuse program circuit 30 produces low-voltage instructing signals LVC and #LVC. Fuse program circuit 30 includes a link element (fuse element) that can be blown off. Between low-voltage instructing signals LVC and #LVC, one and the other are set to L and H levels by selectively blowing off the link element, respectively.

Alternatively to the construction of fuse program circuit 30 shown in FIG. 10, low-voltage instructing signals LVC and #LVC may be produced by setting the voltage level of a specific bonding pad through the use of a bonding wire or the like. Further, a mask interconnection may be used for setting the voltage levels of the signals LVC and #LVC in a slice step in a master slice step.

Standby pump circuit 13 and standby VDC circuit 17 have constructions similar to those of pump circuit 11 and VDC circuit 15, respectively, and are merely required to compensate for drop in voltage level of voltage Vbs due to a leakage current or the like during standby. Therefore, standby pump circuit 13 and standby VDC circuit 17 have small charge supply capability to cause small ripples, and are less restrictly required to have responsivity and level detection accuracy as compared to pump circuit 11 and VDC circuit operating in the active cycle.

According to the second embodiment of the invention, the pump circuit or VDC circuit is used for producing the sense boosted power supply voltage, and the circuit producing the sense boosted power supply voltage is switched according to the external power supply voltage level so that the sense boosted power supply voltage at the optimum level can be produced.

For the applications of external power supply voltages being at different voltage levels, respectively, the same circuit construction can be used so that design efficiency is improved.

Third Embodiment

Figure 11:
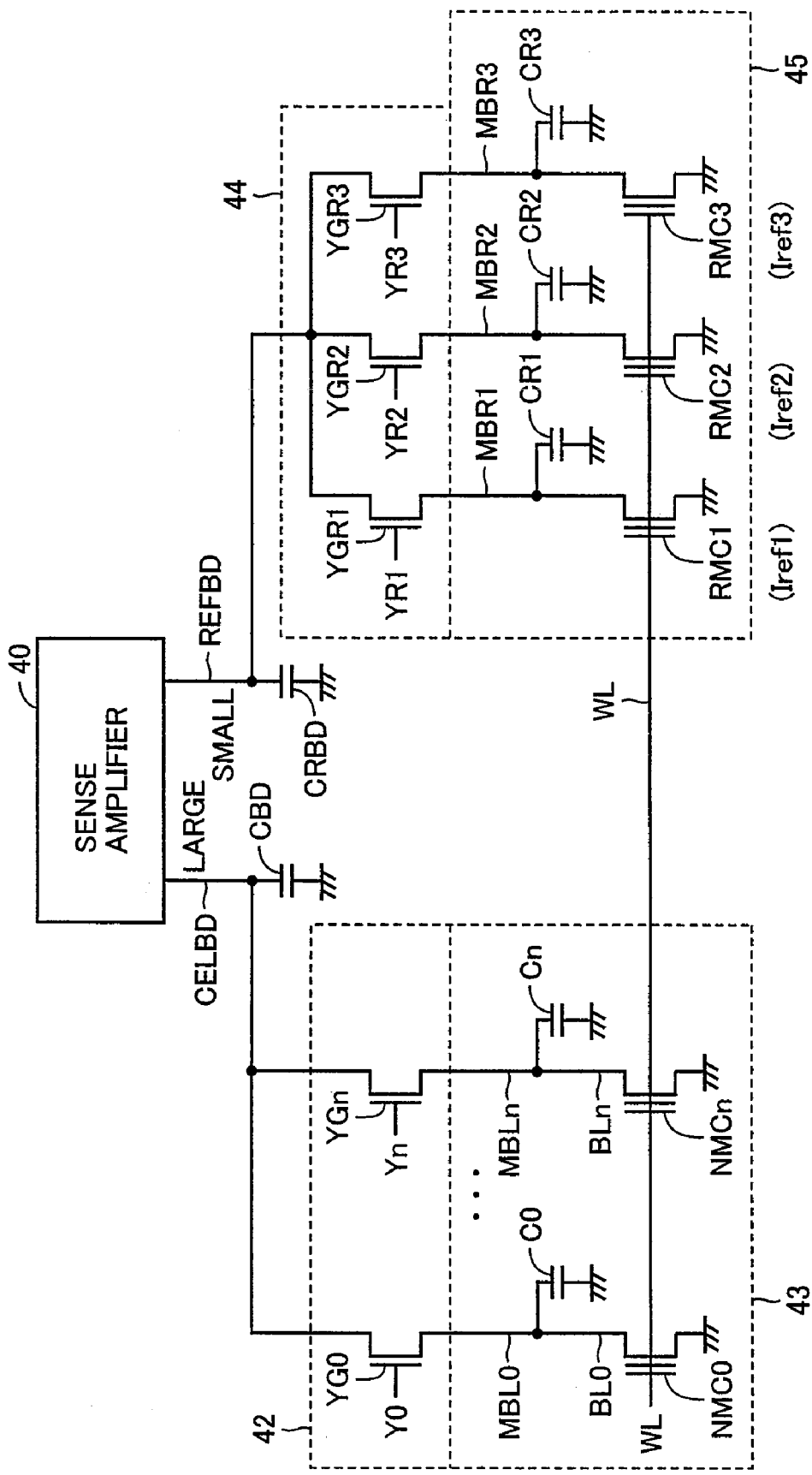
FIG. 11 schematically shows a construction of a main portion of a nonvolatile semiconductor memory device according to a third embodiment of the invention.

FIG. 11 schematically shows a construction of a data read section of a nonvolatile semiconductor memory device according to a third embodiment of the invention. Referring to FIG. 11, a sense amplifier 40 has a configuration as shown in FIG. 2 or 5, by way of example. Sense amplifier 40 is connected to internal read data line CELBD and reference data line REFBD, which in turn are connected to capacitances CBD and CRBD, respectively.

Internal read data line (referred to as a "cell sense node" hereinafter) CELBD is connected to main bit lines MBL0-MBLn of a memory cell array 43 via a column select gate circuit 42. Column select gate circuit 42 includes Y select gates YG0-YGn provided corresponding to main bit lines MBL0-MBLn and receiving Y select signals Y0-Yn on their respective gates. Main bit lines MBL0-MBLn are connected to bit lines BL0-BLn via block select gates (not shown), respectively. FIG. 11 does not show the block select gates for the sake of simplification of the figure.

Bit lines BL0-BLn are connected to memory cells NMC0-NMCn, respectively. Word line WL is provided commonly to memory cells NMC0-NMCn aligned in one row. Capacitances C0-Cn are present on main bit lines MBL0-MBLn, respectively. These capacitances C0-Cn may be parasitic capacitances such as interconnection capacitances, or may be formed of actual capacitance elements each having opposing electrodes and an insulating film interposed between the opposing electrodes.

A reference data line (referred to as a "reference sense node" hereinafter) REFBD connected to sense amplifier 40 is coupled to a reference cell array 45 via a reference cell select gate circuit 44. This reference cell array 45 includes reference cells RMC1-RMC3 coupled to word line WL. Reference cells RMC1-RMC3 drive reference currents Iref1, Iref2 and Iref3 when they are made conductive, respectively. Reference currents Iref1, Iref2 and Iref3 are different in value from each other. When reading four-level data (quaternary data), one among these reference cells RMC1-RMC3 is selectively made conductive according to data to be read, so that the value of the four-level data is determined according to "a binary searching method."

In this reference cell array 45, the reference cells are coupled to reference main bit lines MBR1-MBR3, respectively, via block select gates, similarly to memory cell array 43. Capacitances CR1-CR3 are present on reference main bit lines MBR1-MBR3, respectively. Capacitances CR1-CR3 may be parasitic capacitances such as interconnection capacitances, or may be actual capacitance elements.

Cell select gates YGR1-YGR3 are provided corresponding to reference main bit lines MEBR1-MBR3, respectively. Cell select gates YGR1-YGR3 receive cell select signals YR1-YR3 on their gates, respectively, and are commonly coupled to reference data line (reference sense node) REFBD.

Each of memory cells NMC0-NMCn stores four-level data. Thus, reference cell select signal YR2 among reference cell select signals YR1-YR3 is first driven to the selected state, to supply reference current Iref2 of an intermediate value, which in turn is compared with drive current Icel of the memory cell. According to a result of this first comparison, one of cell select signals YR1 and YR3 is driven to the selected state. Therefore, a sequence of selecting the reference cell select signals YR1-YR3 is determined according to storage data of the selected memory cell.

When reading (sensing) data in a memory cell, the voltage level of word line WL is kept constant. The reference cell is switched to change the reference current. Consequently, the memory cell data is read through the sensing operation of sense amplifier 40 faster, as compared to the case of changing the word line voltage.

In the construction shown in FIG. 11, the capacitances associated with sense nodes CELBD and REFBD are set to satisfy the following relationship:

$$CBD+Ci>CRBD+CRj: i=0-n, j=1-3.$$

Specifically, the value of the capacitance connected to cell sense node CELBD is always larger than the capacitance value of reference sense node REFBD. Description will now be given on an operation of reading four-level data in the nonvolatile semiconductor memory device shown in FIG. 11.

Figure 12:
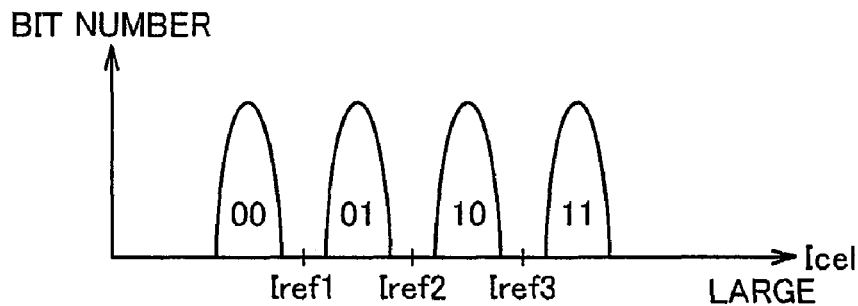
FIG. 12 schematically shows a distribution of a memory cell current according to the third embodiment of the invention.

FIG. 12 schematically shows a current distribution of memory cells NMC0-NMCn. Memory cells NMC0-NMCn store one of four-level data (00), (01), (10) and (11), and the drive current (cell current) of the memory cell increases (i.e., threshold voltage decreases) in the order of these four-level data (00), (01), (10) and (11). Reference current Iref1 has a current value intermediate between cell currents respectively corresponding to data (00) and (01). Reference current Iref2 has a current value intermediate between currents respectively corresponding to data (01) and (10). Reference current Iref3 has a current value intermediate between currents respectively corresponding to data (10) and (11).

In reading the four-level data, reference cell RMC2 is first selected to produce reference current Iref2. According to the storage data of a selected memory cell, a cell current larger or smaller than reference current Iref2 is driven, and it is determined, from a result of identification of magnitude relation of the driven cell current to the reference current, whether the higher bit is "0" or "1". Based on the result of this determination, the reference current is set to reference current Iref1 or Iref3. Then, it is determined whether the lower bit is "0" or "1". By these sense operations performed twice, the four-level data can be read.

Figure 13:
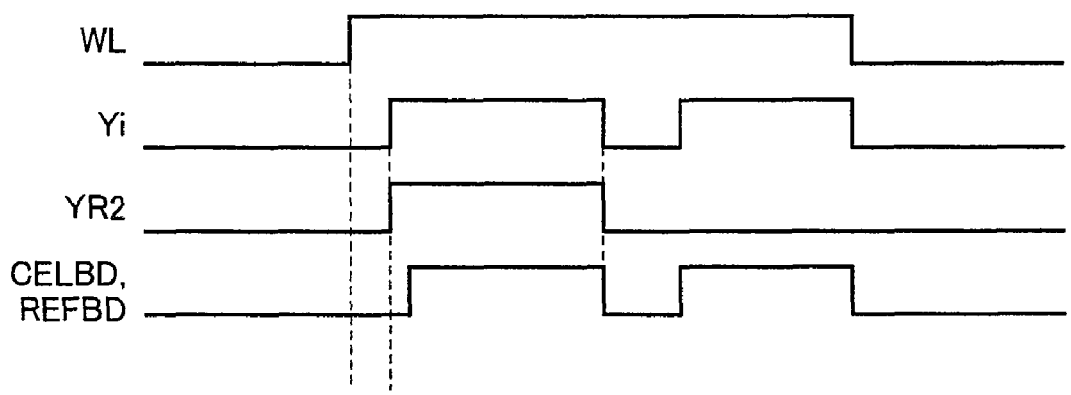
FIG. 13 is a timing chart representing a sense operation of a sense amplifier shown in FIG. 11.

FIG. 13 is a timing chart representing an operation for data reading in the nonvolatile semiconductor memory device shown in FIG. 11. Referring to FIG. 13, the data read operation of the nonvolatile semiconductor memory device shown in FIG. 11 will now be described.

First, word line WL is driven to the selected state, and the voltage level thereof attains a predetermined level, or H level.

In column select gate circuit 42, a Y-select signal Yi is driven to the selected state according to the address signal, and a main bit line MBLi in this selected column is coupled to cell sense node CELBD. Likewise, in reference cell select gate circuit 44, reference cell select signal YR2 attains the H level, and reference main bit line MBR2 connected to reference cell RMC2 is coupled to reference sense node REFBD.

Then, sense amplifier 40 turns active, and sense nodes CELBD and REFBD are driven to the predetermined voltage level according to the precharge current supplied from sense amplifier 40, as described in relation to the first embodiment. When sense nodes CELBD and REFBD attain a constant voltage level, reference cell RMC2 and selected memory cell NMCi (not shown) have the common drain potential. Consequently, a differential amplification of the drive currents of selected memory cell NMCi and reference cell RMC2 can be performed.

When according to reference cell select signal YR2, the reading of the higher bit of selected memory cell NMCi completes, Y-select signal Yi and reference cell select signal YR2 once set to the L level. Sense amplifier 40 is once deactivated, and sense nodes CELBD and REFBD are precharged to the ground voltage level. Y-select signal Yi and reference cell select signal YR1 or YR3 are driven to the selected state again. The data previously read in the first sense operation decides which of reference cell select signals YR1 and YR3 is to be driven to the selected state. The sensing operation similar to the first sense operation is performed after the voltage levels of sense nodes CELBD and REFBD converge to the same level.

Figure 14:
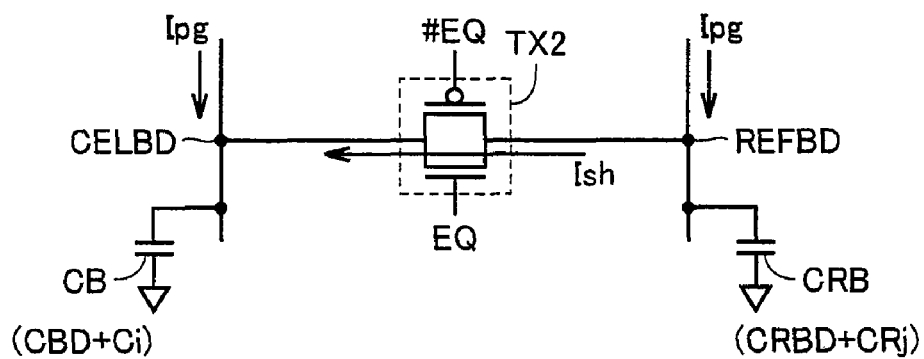
FIG. 14 schematically shows a current path for a sense node shown in FIG. 11.

In this sense operation, the capacitance values of sense nodes CELBD and REFBD are imbalanced. In the precharge operation by sense amplifier 40, sense nodes REFBD and CELBD are electrically short-circuited by CMOS transmission gate TX2, as shown in FIG. 14. Capacitance CRB (=CRBD+CRj) for reference sense node REFBD is smaller than the capacitance (=CBD+Ci) of cell sense node CELBD, and therefore, the potential of reference sense node REFBD rises more rapidly than the potential of cell sense node CELBD. In this state, since CMOS transmission gate TX2 is conductive, a current Ish flows from reference sense node REFBD to cell sense node CELBD, and is supplied, in addition to precharge current Ipg, to the bit line connected to the selected memory cell. Thereby, the potential rising rate of cell sense node CELBD increases, and the voltage levels of sense nodes CELBD and REFBD can rapidly converge to a predetermined voltage level so that the sense operation can be performed at a faster timing. Since the capacitance values of the sense nodes are imbalanced, the voltage levels of these sense nodes CELBD and REFBD can likewise converge rapidly to the predetermined voltage level in the second sense operation so that the second sense operation can start at a faster timing, and thus the access time can be shortened.

In the above construction, the capacitance value of the capacitance connected to reference sense node REFBD of sense amplifier 40 is smaller than that of cell sense node CLBD connected to the selected memory cell. This configuration can be implemented by the arrangement, in which actual capacitance elements having adjusted capacitance values are connected to sense nodes REFBD and CELBD. Alternatively, such configuration may be used, in which the length or width of the interconnection to reference sense node REFBD is reduced to reduce the parasitic capacitance thereof.

It has been described on the case where memory cell NMC stores four-level data. However, even in the case where the memory cell stores binary data ("1" and "0"), the sense operation is performed only once so that the sense operation can likewise start at a faster timing, and the access time can be reduced.

According to a third embodiment of the invention, as described above, the capacitance of the reference sense node of the sense amplifier is made smaller than the capacitance of cell sense node of the sense amplifier, and the potentials of these sense node and reference sense node can rapidly converge to a predetermined voltage so that the access time can be reduced.

Fourth Embodiment

Figure 15:
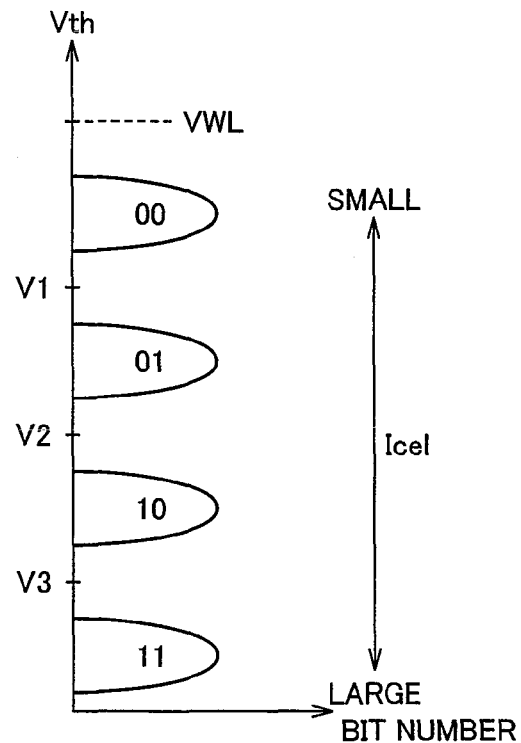
FIG. 15 schematically shows a threshold voltage distribution of memory cells of a nonvolatile semiconductor memory device according to a fourth embodiment of the invention.

FIG. 15 schematically shows an example of a distribution of threshold voltages of storage data of memory cells in a fourth embodiment of the invention. FIG. 15 illustrates a distribution of the threshold voltages of the memory cells storing four-level data. The threshold voltage of the memory cell storing data (11) is lower than a voltage V3. The threshold voltage of the memory cell storing data (10) is distributed between voltages V2 and V3. The threshold voltage of the memory cell storing data (01) is distributed between voltages V1 and V2. The threshold voltage of the memory cell storing data (00) is at a level higher than voltage V1 and lower than a word line read voltage VWL applied to a word line in data reading operation. As the threshold voltage of the memory cell lowers, memory cell current Icel, which flows when word line read voltage VWL is applied, increases. Therefore, the drive current of the memory cell storing data (11) is larger than the drive current of the memory cell storing data (00) in the data read operation.

In the erasure operation and the write (programming) operation, the threshold voltage is set according to the storage data of the memory cell. The state of the lowest threshold voltage will be referred to as an "erased state" hereinafter. Thus, the state, in which data (11) is stored, is the erased state. After the erasure operation, the threshold of the memory cell is successively increased according to the storage data, to write data. In the write operation and the erasure operation, a verification operation is performed to determine whether the threshold voltage of the memory cell is present between the upper and lower limits of the corresponding distribution range of the threshold voltage.

In the verification operation, a verify reference current is produced by using a verifying sense amplifier, upper and lower limit currents are set for each data (logic value), and it is determined whether the memory cell current exists in a region defined by the verify reference current. In the conventional verification operation, a word line is supplied with a same word line read voltage VWL as in a normal data read operation (external reading of data).

After writing (erasing and programming) the four-level data, the memory cells exhibit the current distribution as shown in FIG. 12. In the verification operation based on this current distribution, verify currents of the upper and lower limit values of each cell current region are produced, and are compared with the drive current of the memory cell. The verifying sense amplifier used in the verification operation has the same configuration as a sense amplifier for normal data reading, and the sense amplifier may be used commonly for both the verification operation and the data read operation. In the following description, however, the verifying sense amplifier is separate from the sense amplifier for normal reading (i.e., the sense amplifier specifically described in the first embodiment) for the sake of simplicity.

Figure 16:
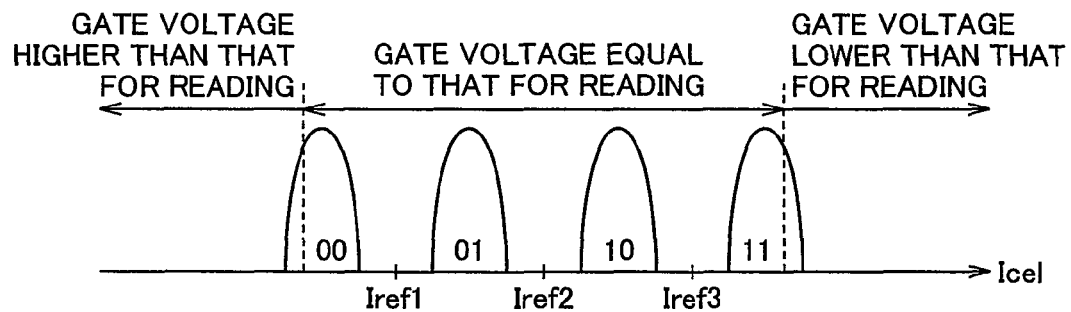
FIG. 16 schematically shows an application manner of a gate voltage in a verification operation of the nonvolatile semiconductor memory device according to the fourth embodiment of the invention.
Figure 17:
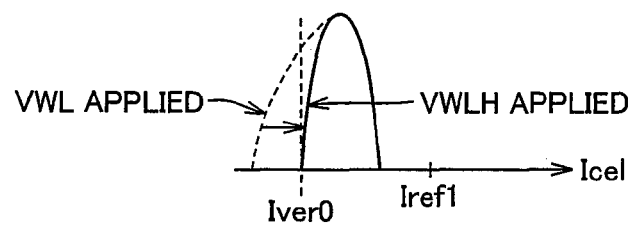
FIG. 17 schematically shows a change in drive current distribution of memory cells in a lower limit range of a current distribution illustrated in FIG. 16.

In the verification operation, as illustrated in FIG. 16, for the verification operation for the memory cell at a lower region of the lowest side (data (00)) in the current distribution region, the word line voltage (gate voltage of the memory cell transistor) is set to a voltage level higher than voltage VWL applied in the normal read operation for performing the verification operation. In the verification operation of the cell in the lowest side of the current distribution, the cell current flowing upon application of read voltage VWL may be lower than a lower-side verify current Iver0, as illustrated in FIG. 17. In this case, the memory cell is substantially non-conductive, and the drive current thereof is extremely small. The sense amplifier supplies a same cell current as in the normal reading, so that the memory cell data can be accurately sensed, and the accurate verification operation can be ensured. In this case, erasing is effected again on the memory cell, of which cell current is smaller than the lower limit current, to increase the threshold voltage thereof. Thereby, the drive current distribution, i.e., the threshold voltage distribution can be accurately narrowed, and the drive current distribution region corresponding to each data value can be narrowed when the multi-level data is stored so that a margin for each reference current of the multi-level data can be increased.

When a memory cell in the above current distribution is to be verified, or when verification is made with the lower limit current, a voltage VWHL higher than read word line voltage VWL applied in the normal data read operation, is applied for the verification operation. In this case, the drive currents of the memory cells in a region represented by dotted line in FIG. 17 increase to exceed lower-side verify current Iver0. Thus, it can be verified accurately that these memory cells store data of (00). In verification operation on the upper limit in the distribution region of the memory cells of data (00), an upper limit verify current is supplied to determine accurately that the drive current of the memory cells storing data (00) are lower than reference current Iref1. The identifiable region of the current distribution of the memory cells storing data (00) can be expanded on the lower limit side, so that the verification operation can be accurately performed.

Figure 18:
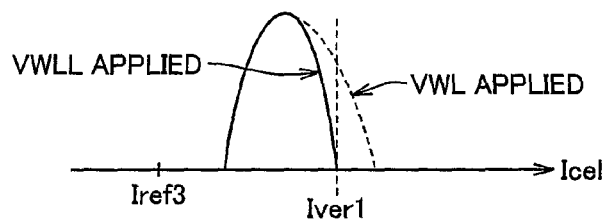
FIG. 18 schematically shows a change in distribution of memory cell drive currents during a verification operation of memory cells in an upper limit region of the current distribution shown in FIG. 16.

For verifying the memory cells in a top portion of the current distribution, as shown in FIG. 16, a gate voltage lower than read word line voltage VWL is applied. In this state, as shown in FIG. 18, the drive current of the memory cell as represented by dotted line when normal read word line voltage VWL is applied, decreases to a level smaller than an upper limit verify current Ivref1 when a lower verify word line voltage VWLL is applied.

In the memory cell at the top side of the current distribution, a current flows excessively, and a bit line voltage level can not be maintained due to voltage drop across an interconnection resistance and others, so that the drain voltage of the memory cell lowers. Consequently, cell current Icel is reduced, and the memory cell current distribution spreading on the top side can not be obtained accurately. The excessive current driven by a memory cell in the top side of the current distribution may increase the current consumption when a boosted voltage is used as a power supply of the sense amplifier, and boosted voltage generating circuitry possibly may not produce stably the boosted voltage by. In the verification operation at the top side of the memory cell current distribution, the word line voltage is set to voltage VWLL lower than read word line voltage VWL, for performing the verification operation. Thereby, it is possible to determine the distribution of the memory cell currents in a wider range than that in the case of using read word line voltage VWL, and the memory cell driving the excessive cell current can be identified, so that the drive current can be reduced by raising the threshold voltage of such a memory cell. Thus, the upper limit identifiable region of the current distribution is widened, and the threshold voltage can be adjusted according to a result of such identification. Accordingly, the threshold voltage distribution can be made narrower, and the distribution of the cell current to the sense amplifier can be small so that the accurate sense operation can be ensured.

In the verification operation in the write/erasure operations, by changing the word line voltage depending on the position in the current distribution of a memory cell to be verified, instead of performing the verification operation through the use of read word line voltage VWL, the identifiable regions at the top and bottom limits of the memory cell current distribution can be widened, so that the verification for write/erasure can be accurately performed, and the write/erasure time periods can be reduced.

In the verification operation for the current distribution near middle reference currents Iref1, Iref2 and Iref3, the word line voltage in the verification operation is set to the same voltage level as read word line voltage VWL. Thereby, the word line voltage in the data read operation is equal to that in the verification operation, and the sense operation can be precisely performed in the verification operation and the normal operation.

In FIG. 18, the verification operation for the memory cell in the uppermost limit region of the memory cell current distribution may be performed such that voltage VWLL is applied to the word line, and the verification operation is performed by determining whether the cell current is larger than reference current Iref3. Now, the following state is assumed. In the memory cells storing data (11), when 6 V is applied to the word line, a cell in a low limit region drives a current of 60 μA, and the memory cell in upper limit drives 100 μA. For this case, word line voltage is set to 4 V, to set the drive current of the memory cell in the upper limit region to 60 μA. In the sense amplifier, the memory cell current is 60 μA for both the upper and lower limit regions of data (11), and a current of the same magnitude as reference current Iref3 can be used as the verify current for accurate sensing operation. In this case, however, the word line voltage likewise lowers in the reference cell, and the drive current of the reference cell is made small. Therefore, the verification operation for the upper limit region can not be performed by using the reference current driving the reference cell (because the current driven by the reference cell is smaller than reference current Iref3). In this case, the verifying current is separately produced for performing the verification operation by utilizing the verify reference cell or a constant current circuit.

For the lower limit region of the current distribution of data (00), the verify word line voltage may be raised, while using reference current Iref1 as the verify current. In this case also, the reference current is produced by using a separate verify current generating circuit.

Figure 19:
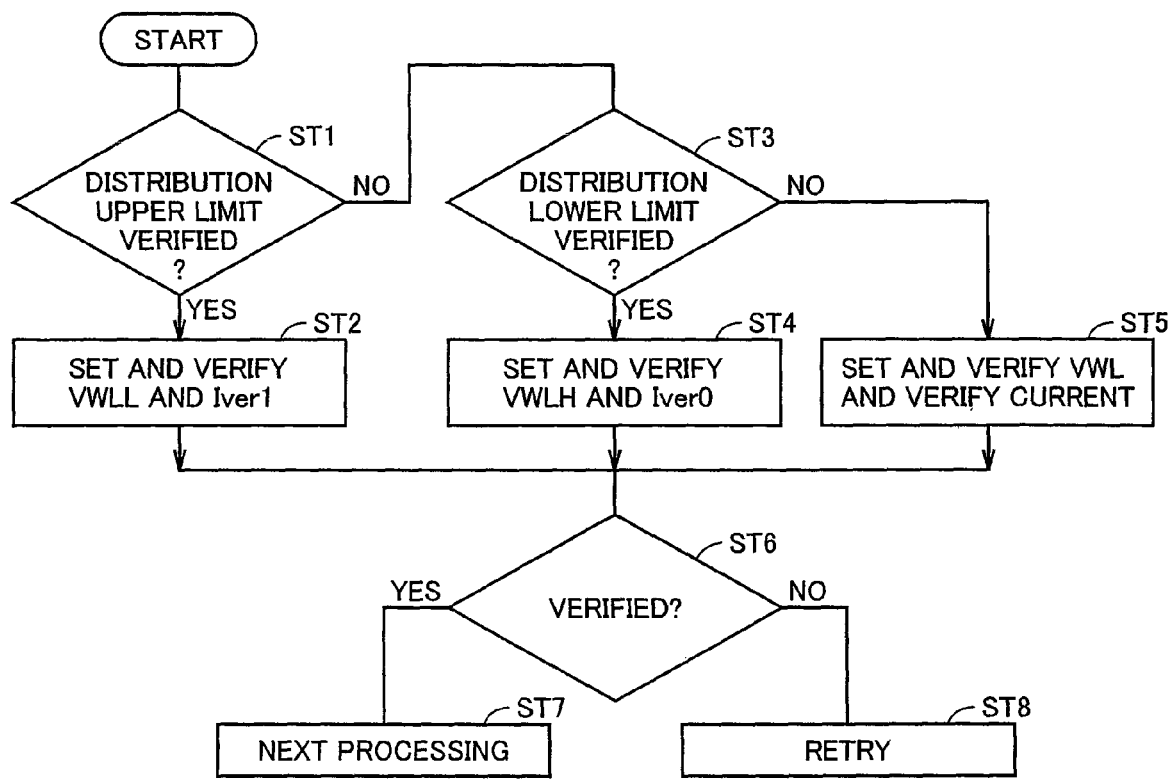
FIG. 19 is a flowchart representing an operation during a verification operation of the nonvolatile semiconductor memory device according to the fourth embodiment of the invention.

FIG. 19 is a flowchart representing the verification operation of the semiconductor memory device according to the fourth embodiment of the invention. Referring to FIG. 19, description will now be given on the verification operation according to the fourth embodiment of the invention. In a write sequence, which will now be described by way of example, the threshold voltage of the memory cell is successively changed from a lower level to a higher level.

In the verification operation, all the memory cells are first set to the state of a low threshold voltage, and it is determined whether the verification operation is to be performed on the distribution upper limit (upper limit value of the current distribution) (step ST1). When the verification operation is to be performed on the cell in the upper limit of the current distribution, the word line voltage is set to voltage VWLL, and verify current Iverf1 is set as the reference current. Then, the verification operation is performed (step ST2).

When it is determined in step ST1 that the verification is to be performed on a cell at a region other than the upper limit of the distribution, it is then determined whether the verification operation is to be performed on the lower limit value of the cell current distribution, i.e., on the state of the maximum threshold voltage (step ST3). When the verification operation is to be performed on the memory cell in the lower limit region of the current distributions the word line voltage is set to voltage VWLH, verify current Iver0 is used as the reference current, and the verification operation is performed (step ST4).

When the verification is to be performed on a region other than upper and lower limit regions of the current distribution, the verify current is set according to the upper or lower limit of the current distribution of the region of storage data of interest. In this case, read word line voltage VWL is applied onto the word line, and the verification operation is performed (step ST5).

In the verification operations in steps ST2, ST4 and ST5, it is determined whether the corresponding memory cell accurately satisfies the verify current condition (equal to or smaller than, or equal to or larger than the verify current) or not (step ST6). In this verification operation, when it is determined that the predetermined condition is satisfied, next processing is performed according to each verification operation sequence (step ST7). In the verification operation, when it is determined that a failure cell, i.e., a memory cell not satisfying the verify condition is present, the threshold voltage of the failure cell is re-adjusted (step ST8). After this retrial step (ST8), an operation flow returns back to step S1, and the verification operation is performed.

The verification operation is effected on each data (each level of four-level data) after each data write operation including erasure is performed depending on the storage data of the memory cells.

When the write/erasure of the memory cell data is performed, the verification operation is performed according to the predetermined verifying sequence. In this verification operation, the voltage level of word line voltage Vw supplied from internal voltage generating circuit 6 is adjusted under the control of control circuit 5 shown in FIG. 1, and the verify current is set to the current level corresponding to the data (one of (00), (01), (10), and (11)) to be verified, and is supplied to the verify sense amplifier included in read circuit 4 shown in FIG. 1. When the sense amplifier in read circuit 4 is used for both the verification operation and the data read operation, the verify current is supplied to the sense amplifier in place of the reference current supplied from the reference cell.

According to the fourth embodiment of the invention, as described above, the word line voltage in the verification operation is adjusted for the upper (top) and lower (bottom) limits of the current distribution of the memory cells, and the identifiable regions of the memory cells in the upper and lower limit regions can be widened so that an accurate verification operation can be achieved.

The memory cells in the region between the upper and lower limit regions of the current distribution are supplied with the verify voltages at the same level as that for data reading, and the sense operation in the data read operation can precisely match with the sense operation in the write/erasure verification operation so that the precise sense operation can be achieved.

Fifth Embodiment

Figure 20:
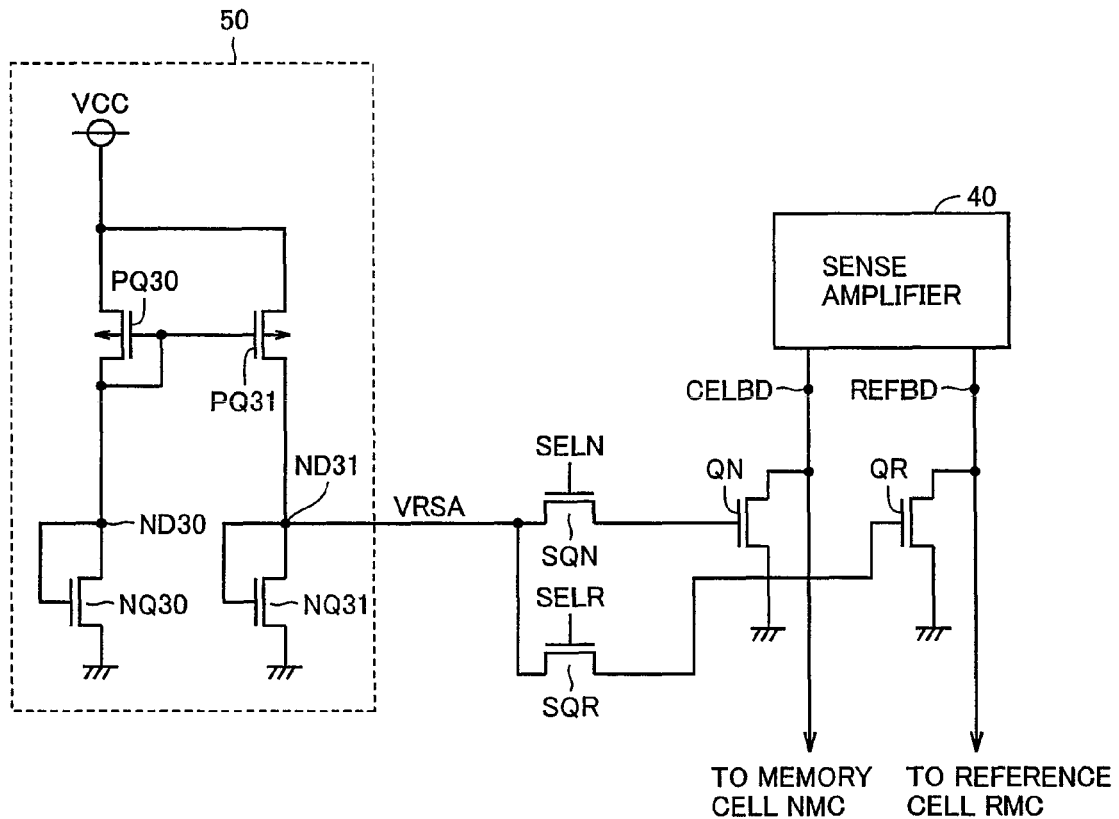
FIG. 20 schematically shows a construction of a main portion of a nonvolatile semiconductor memory device according to a fifth embodiment of the invention.

FIG. 20 shows a construction of a portion related to a sense amplifier of a nonvolatile semiconductor memory device according to a fifth embodiment of the invention. In FIG. 20, sense amplifier 40 has a same construction as that of the sense amplifier of the first embodiment, and has sense nodes CELBD and REFBD coupled to memory cell NMC and reference cell RMC during the sense operation, respectively. In FIG. 20, to sense amplifier 40, there are further provided a constant voltage generating circuit 50 for producing a constant voltage VRSA, a transfer gate SQN for transferring constant voltage VRSA according to a select signal SELN, an N-channel MOS transistor QN coupled to sense node CELBD and receiving constant voltage VRSA on its gate via transfer gate SQN, to discharge the constant current from sense node CELBD to the ground node, a transfer gate SQR for transferring constant voltage VRSA according to a select signal SELR, and an N-channel MOS transistor QR receiving constant voltage VRSA on its gate via transfer gate SQR, to discharge a constant current from reference sense node REFBD to the ground node.

Constant voltage generating circuit 50 includes a P-channel MOS transistor PQ30 connected between an internal power supply node and node ND30 and having a gate connected to node ND30, an N-channel MOS transistor NQ30 connected between internal node ND30 and a ground node and having a gate connected to node ND30, a P-channel MOS transistor PQ31 connected between a power supply node and an internal node ND31 and having a gate connected to internal node ND30, and an N-channel MOS transistor NQ31 connected between node ND31 and the ground node and having a gate connected to node ND31.

MOS transistors NQ31, QN and QR have the same size (a ratio of a channel width to a channel length). P-channel MOS transistors PQ30 and PQ31 form a current mirror stage, and MOS transistor PQ31 supplies a mirror current of a current flowing through MOS transistor PQ30 from the internal power supply node. The current supplied to node ND30 from MOS transistor PQ30 is converted into a voltage by the MOS transistor NQ30, to set the voltage level of node ND30 at such a level that the drive currents of MOS transistors PQ30 and NQ30 are equal to each other. Accordingly, the constant current flows through MOS transistors PQ30 and NQ30. The mirror current of this constant current flows through MOS transistor PQ31. MOS transistor NQ31 functions as a current to voltage converter element converting the current supplied from MOS transistor PQ31 to the voltage, to produce constant voltage VRSA.

Select signals SELN and SELR are at the voltage level sufficiently higher than the level of constant voltage VRSA. Transfer gates SQN and SQR, when made conductive, transfer the constant voltage VRSA to gates of MOS transistors QN and QR without a loss of the threshold voltage, respectively. When transfer gate SQN is conductive, MOS transistors NQ31 and QR form a current mirror circuit, and a current of the same magnitude as the current flowing through MOS transistor NQ31 flows through MOS transistor QN (assuming that these have the same size). Likewise, when transfer gate SQR is conductive, MOS transistors NQ31 and QR form a current mirror circuit, and MOS transistor QR drives a current of the same magnitude as the current driven by MOS transistor NQ31 (assuming that these have the same size).

When constant voltage generating circuit 50 is configured to have the size (channel width) of MOS transistor PQ30 variable, constant voltage VRSA can be produced at a variable voltage level to set the current amount driven by MOS transistors QN and QR to a desired value. The operation of the circuit shown in FIG. 20 will now be described below.

(i) SELN=L level, and SELR=H level

In this state, transfer gate SQN is non-conductive, and transfer gate SQR is conductive, so that transistor QR provided for reference cell RMC operates as a constant current source. In this state, memory cell NMC is selected, but reference cell RMC is not selected, and sense amplifier 40 performs the sense operation. In this case, the sense operation can be performed with a current value different from a reference current value defined by reference cell RMC. In this state, therefore, the drive current of MOS transistor QR can be changed by changing the size of MOS transistor PQ30 of constant voltage generating circuit 50 to change constant voltage VRSA. Thereby, the value of current flowing through memory cell NMC can be analyzed in detail.

(ii) SELN=H level and SELR=L level

In this state, transfer gate SQN is conductive, and transfer gate SQR is non-conductive, so that MOS transistor QN drives the constant current from cell sense node CELBD according to constant voltage VRSA. In this state, memory cell NMC is not selected, and reference cell RMC is selected when sense amplifier 40 performs the sense operation. The size (channel width) of MOS transistor PQ30 can be changed to change the drive current thereof. Accordingly, constant voltage VRSA generated from constant voltage generating circuit 50 can be changed, and thus the current driven by MOS transistor QN can be changed. In this case, therefore, the value of the current flowing through reference cell RMC can be analyzed in detail. When the reference current is to be set to a desired value, the threshold voltage of the reference cell can be controlled by using the result of this sense operation, so as to achieve the desired reference current.

(iii) SELN=H level and SELR=H level

In this state, both transfer gates SQN and SQR are conductive, and both MOS transistors QN and QR drive a constant current. In this state, both memory cell NMC and reference cell RMC are selected, and thereby an offset can be provided between the currents flowing through sense nodes CELBD and REFBD of sense amplifier 40.

In a general differential amplifier, the sensitivity to the current value is not uniform, and a current range of a high sensitivity generally called hit range and a current range of a relatively low sensitivity are present. By turning on both MOS transistors QN and QR, an offset can be provided between the currents flowing through the current mirror stage of sense amplifier 40, and accordingly, sense operation can be performed with a current range shifted to the high sensitivity current region, so that differential amplification of the currents can be precisely achieved.

Therefore, by connecting the constant current sources to sense nodes CELBD and REFBD of sense amplifier 40, respectively, and rendering them active selectively and independently of each other for driving the constant currents, it is possible to analyze in detail the currents flowing through a memory cell and a reference cell. Also, the offset current can be supplied to the sense nodes of sense amplifier 40, so that the sense operation can be performed in the region of the high sense sensitivity, and the sense operation can be performed precisely.

In the construction shown in FIG. 20, when transfer gates SQN and SQR are non-conductive, the gates of MOS transistors QN and QR enter the floating state. In this case, by using the N-channel MOS transistors made conductive complementarily to transfer gates SQN and SQR, the gates of MOS transistors QN and QR can be coupled to the ground node, to prevent the gates of MOS transistors QN and QR from entering the floating state.

In place of transfer gates SQN and SQR, CMOS transmission gates may be used.

Figure 21:
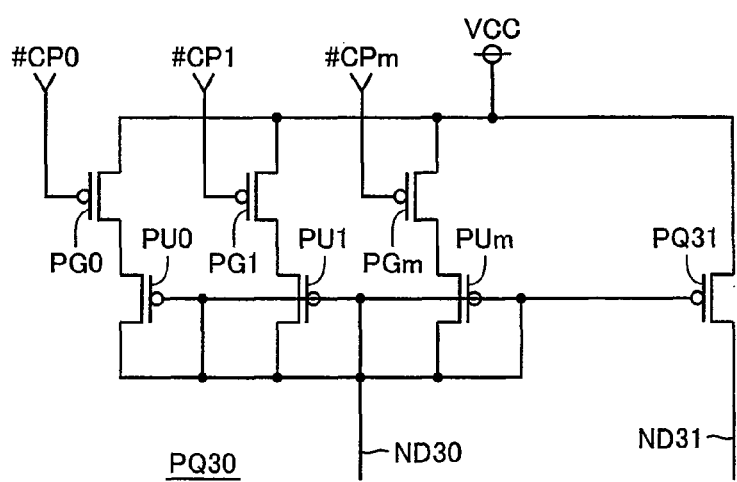
FIG. 21 shows by way of example a structure of a constant current supply current mirror stage shown in FIG. 20.

FIG. 21 shows by way of example a configuration for changing the size of MOS transistor PQ30 in constant voltage generating circuit 50 shown in FIG. 20. In FIG. 21, P-channel MOS transistor PQ30 includes P-channel MOS transistors PG0-PGm coupled to the internal power supply node, and unit P-channel MOS transistors PU0-PUm connected in series to MOS transistors PG0-PGm, respectively. Each of MOS transistors PU0-PUm has a gate and a drain connected together to internal node ND30. MOS transistors PG0-PGm receive control signals #CP0-#CPm on their gates, respectively. Internal node ND30 is connected to the gate of MOS transistor PQ31.

MOS transistors PG0-PGm have the on-resistances set to sufficiently small values. By selectively turning on MOS transistors PG0-PGm, a corresponding transistor among unit MOS transistors PU0-PUm drives the current, and functions as a master stage transistor in the current mirror stage. MOS transistors PG0-PGm are selectively turned on to change the drive current amount of transistor PQ30 of the current mirror stage in a step of the drive current amount of the unit transistor so that the drive current of MOS transistor PQ31 can be adjusted.

MOS transistor PQ31 has a size so adjusted as to achieve a mirror ratio of unity when a predetermined number of unit transistors among unit transistors PU0-PUm are turned on. Thus, MOS transistors PG0-PGm can be selectively turned on so that a mirror ratio m of the drive currents of MOS transistors PQ31 and PQ31 can be set to a value smaller than unity, and to a value greater than unity. Consequently, the drive current of MOS transistor PQ31 can be selectively increased and decreased.

It is sufficient to selectively activate control signals #CP0-#CPm by a test control circuit included in control circuit 5 shown in FIG. 1 in the test mode. When the offset current of the sense amplifier is to be set, control signals #CP0-#CPm are selectively set to the active state (L level) in a register circuit formed of nonvolatile memory elements, or a programming with fuses in a fuse program circuit is performed according to a result of analysis.

For selective selection of a memory cell and a reference cell, selection of the column select gates or block select gates for the memory cell and the reference cell is selectively enabled.

According to the fifth embodiment, as described above, the constant current sources are selectively coupled to the sense nodes of the sense amplifier, and these constant current sources are made active/inactive separately from each other, so that the current characteristics of the memory cell and the reference cell can be analyzed in detail, and the operation range of the sense amplifier can be set to an optimum range.

Sixth Embodiment

Figure 22:
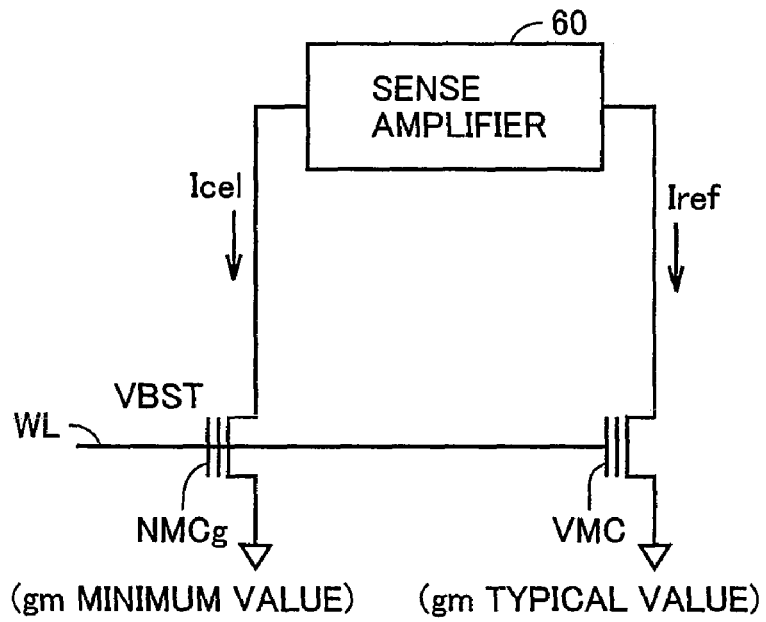
FIG. 22 schematically shows connections in a verifying mode of a verify reference cell and a memory cell in a nonvolatile semiconductor memory device according to a sixth embodiment of the invention.

FIG. 22 schematically shows a construction of a main portion of a nonvolatile semiconductor memory device according to a sixth embodiment of the invention. In FIG. 22, a sense amplifier 60 is coupled to memory cell NMCg and verify reference cell VMC. These memory cell NMCg and verify reference cell VMC are commonly coupled to word line WL. It is now assumed that verify reference cell VMC has a trans-conductance gm of a typical value, and memory cell NMCg has a trans-conductance gm of a minimum value. For performing erasure on this memory cell NMCg, an erasure voltage is applied to word line WL to change a threshold voltage of memory cell NMCg. It is assumed that in this erasure operation, trans-conductance gm of memory cell NMCg is increased, or the absolute value of the threshold voltage of memory cell NMCg is decreased.

In the verification operation after the erasure operation and the writing, the trans-conductance gm of memory cell NMCg is increased, and a verifying voltage VBST is applied to word line WL to achieve a state, in which the memory cell NMCg drives the current of the same magnitude as the drive current of the reference cell VMC. It is assumed here that verify reference cells are arranged corresponding to the respective data to be verified (logic levels of multi-level data), and the voltages at the same level are applied to the word line even when data of different levels are to be verified. Such verification operation may be combined with the construction of the fourth embodiment.

Figure 23:
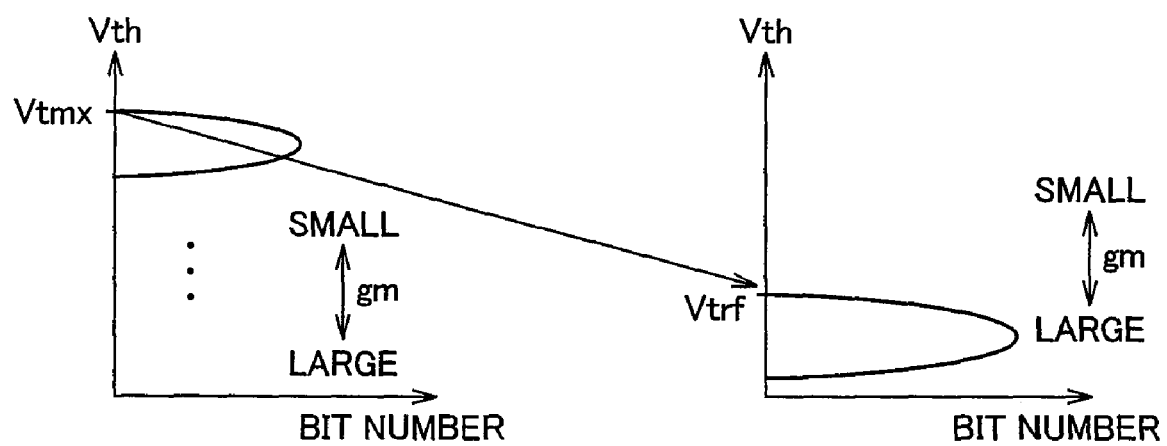
FIG. 23 schematically shows a change in threshold voltage of memory cells in the sixth embodiment of the invention.

As shown in FIG. 23, where a memory cell has a threshold voltage Vth for the smallest trans-conductance gm being the largest voltage Vtmx, such memory cell has the threshold voltage made lower than a threshold voltage Vtrf in the erasure state, and is set to the state of having the same threshold voltage as the verify reference cell having the typical trans-conductance.

Figure 24:
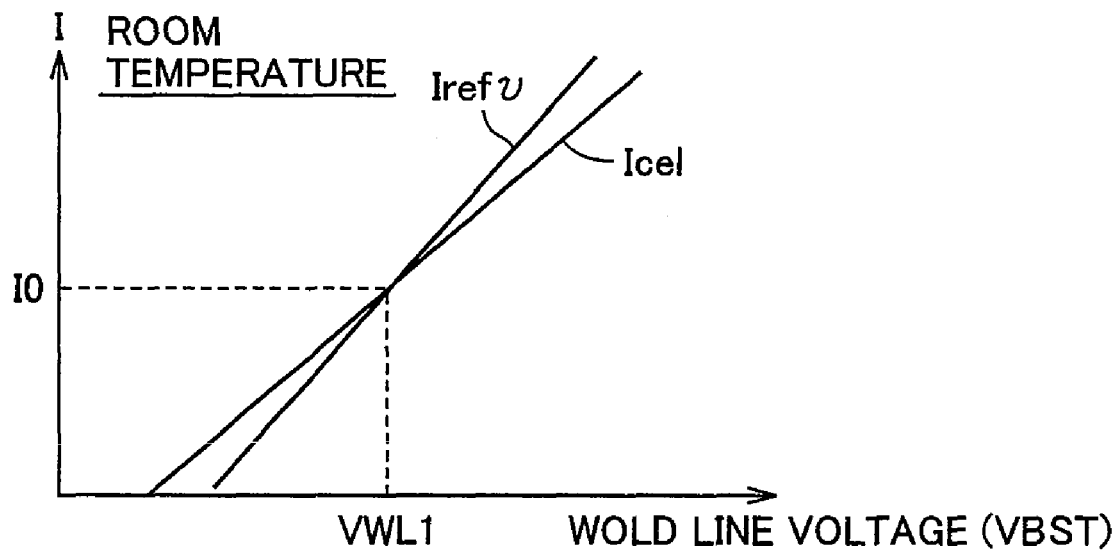
FIG. 24 schematically illustrates Vg-Id characteristics of the memory cell and the verify reference cell in the sixth embodiment of the invention.

In this state, as shown in FIG. 24, a current Irefv driven by verify reference cell VMC and a current Icel driven by memory cell NMCg are equal to a current value I0 at a room temperature when a verify voltage VWL1 is applied. A difference in the gate voltage to drive current characteristics is present between memory cell NMCg and verify reference cell VMC due to variations in manufacturing parameters in the manufacturing process. Therefore, these cells have a different temperature dependency in the relationship between the gate voltage (Vg) and the drive current (Id), or of the Vg-Id characteristics.

Figure 25:
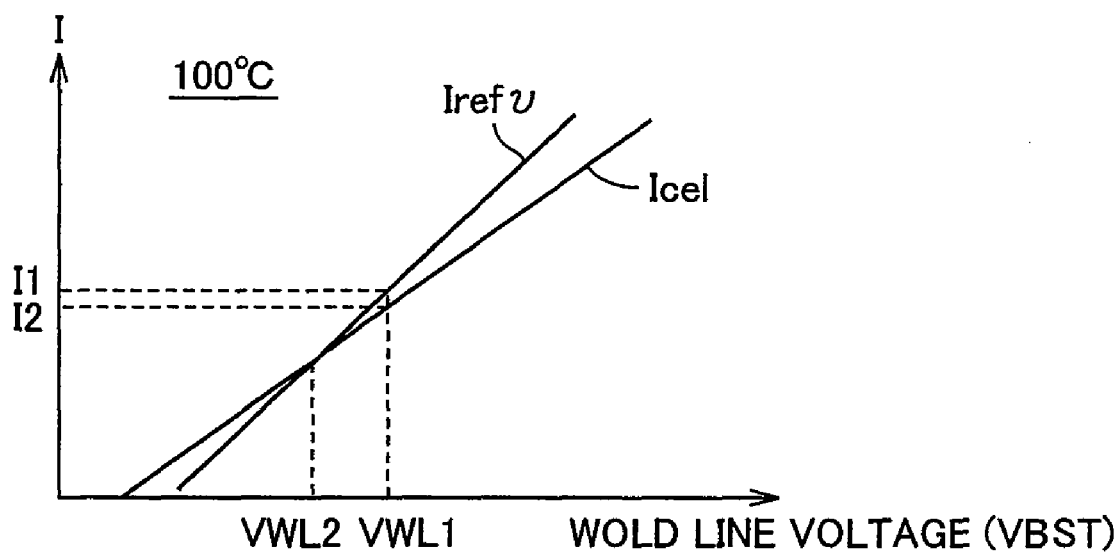
FIG. 25 illustrate Vg-Id characteristics, at a high temperature, of the memory cell and the verify reference cell in the sixth embodiment of the invention.

As shown in FIG. 25, it is assumed here that the current characteristics of verify reference cell VMC and memory cell NMCg change, and the verify reference cell and the memory cell drive currents of I1 and I2, respectively when a voltage VWL1 is applied onto a word line under the condition of a temperature of 100° C. Erasure on all the memory cells is not completed until the cell current Icel is adjusted to be equal to verify reference current Iref in the verification operation. However, where the current values are different as described above, further erasure must be performed for making cell current Icel equal to reference current Iref. This further changes the threshold voltages of the memory cells, and thus expands the threshold voltage distribution of the memory cells.

In the data write (programming) operation after the erasure operation, therefore, a difference likewise occurs between the verify current and the memory cell current for each data in the verification operation, and therefore the threshold voltage distribution likewise expands. When multi-level data is stored, therefore, a space between the threshold voltage distribution regions becomes narrow, and the margin for data reading decreases. For shrinking the threshold voltage distribution, a word line verify voltage VWL2 is applied at a temperature of 100° C. Accordingly, reference current Iref and cell current Icel can be matched with each other, and the threshold voltage distribution similar to that at room temperature can be achieved.

Figure 26:
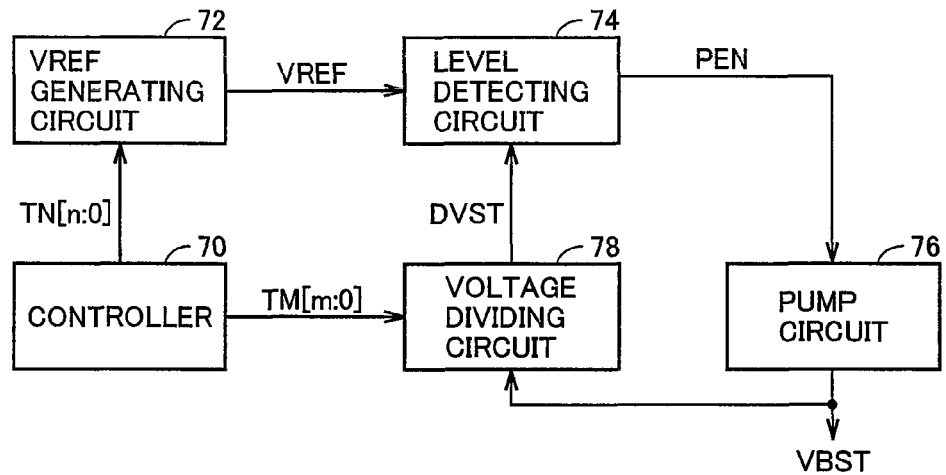
FIG. 26 schematically shows a construction of a verify voltage generating portion in the sixth embodiment of the invention.

FIG. 26 schematically shows a construction of a verify voltage generating section according to the sixth embodiment of the invention. In FIG. 26, the verify voltage generating section includes a controller 70 for producing a multi-bit level control signal TN[n:0] that sets a voltage level of a reference voltage VREF and a multi-bit voltage division control signal TM[n:0] that sets a voltage division ratio of verify voltage VBST, a VREF generating circuit 72 for producing reference voltage VREF having a voltage level set according to multi-bit level control signal TN[n:0] received from controller 70, a voltage dividing circuit 78 for dividing verify voltage VBST according to multi-bit voltage division control signal TM[n:0] to produce a divided voltage DVST, a level detecting circuit 74 for comparing divided voltage DVST received from voltage dividing circuit 78 with reference voltage VREF and producing a pump enable signal PEN according to a result of the comparison, and a pump circuit 76 performing a charge pumping operation to produce a word line verify voltage VBST when pump enable signal PEN is active.

VREF generating circuit 72 changes the voltage level of reference voltage VREF according to multi-bit level control signal TN[n:0] received from controller 70, to adjust the temperature dependency thereof. Voltage dividing circuit 78 adjusts the voltage division ratio of word line verify voltage VBST according to voltage control signal TM[n:0], to compensate for the change in voltage level of reference voltage VREF. Accordingly, the voltage level of verify word line voltage VBST can have the temperature dependency in both the positive and negative directions.

Figure 27:
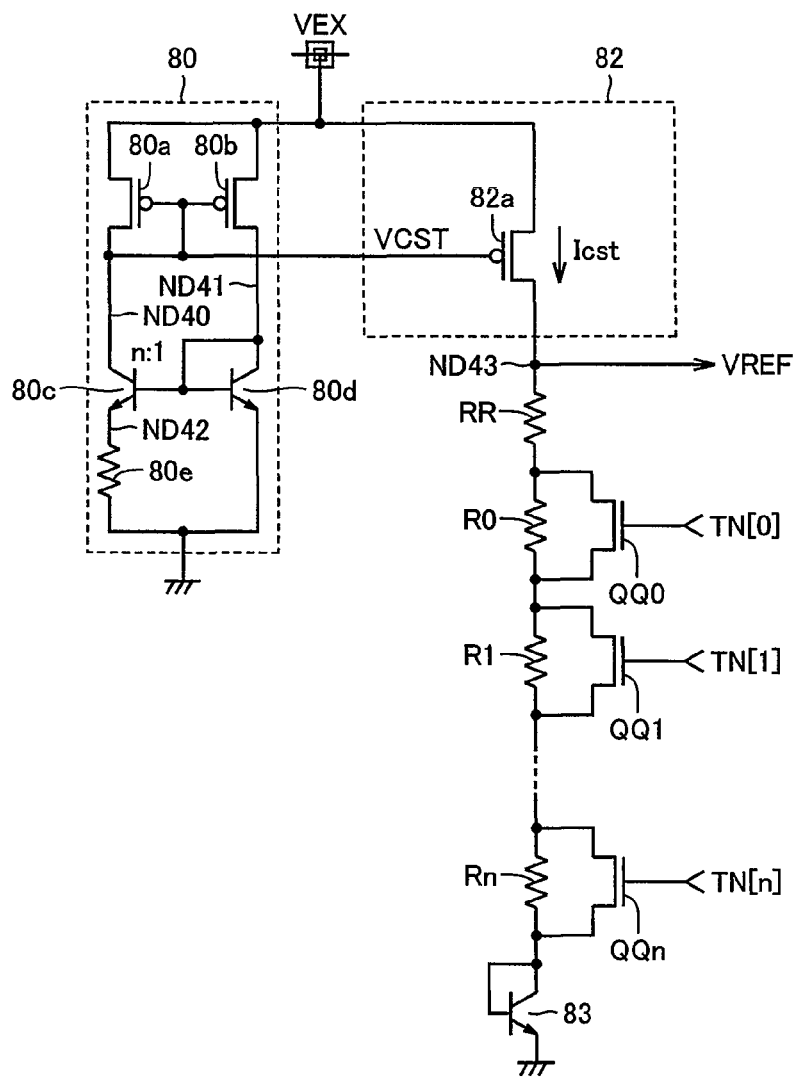
FIG. 27 shows an example of a configuration of a VREF generating circuit shown in FIG. 26.

FIG. 27 shows an example of a configuration of VREF generating circuit 72 shown in FIG. 26. In FIG. 27, VREF generating circuit 72 includes a constant voltage generating circuit 80 for producing, from an external power supply voltage VEX, a constant voltage VCST independent of external power supply voltage VEX, a constant current supply 82 for supplying a constant current Icst of a constant magnitude according to constant voltage VCST supplied from constant voltage generating circuit 80, resistance elements RR and R0-Rn connected in series to an output node ND43 of constant current supply 82, an NPN bipolar transistor 83 connected between resistance element Rn and the ground node and having a base connected to its collector, and N-channel MOS transistors QQ0-QQn connected in parallel to resistance elements R0-Rn and having gates receiving control bits TN[0]-TN[n], respectively.

Constant voltage generating circuit 80 includes a P-channel MOS transistor 80a is connected between an external power supply node and an internal node ND40 and having a gate connected to internal node ND40, a P-channel MOS transistor 80b connected between the external power supply node and an internal node ND41 and having a gate connected to internal node ND40, an NPN bipolar transistor 80c connected between nodes ND40 and ND42 and having a base connected to node ND41, an NPN bipolar transistor 80d connected between internal node ND41 and the ground node and having a base connected to internal node ND41, and a resistance element 80e connected between internal node ND42 and the ground node.

A drive current or an emitter area of bipolar transistor 80c is n times as large as an emitter area (drive current) of bipolar transistor 80d.

In constant voltage generating circuit 80, MOS transistors 80a and 80b form a current mirror stage, and supplies a current of the same magnitude. As for bipolar transistors 80c and 80d, bipolar transistor 80d is formed of one unit bipolar transistor, and bipolar transistor 80c is formed of a number, n, of unit bipolar transistors connected in parallel, for example. Equivalently, bipolar transistor 80c has the emitter area n times as large as the emitter area of bipolar transistor 80d, and has an emitter current n times as large. In this case, a voltage corresponding to a difference in base-emitter voltage Vbe between bipolar transistors 80c and 80d appears on node ND42. Assuming that resistance element 80e has a resistance value of Z(80e), a current I(80e) flowing through resistance element 80e is expressed by the following equation:

$$I(80e) = VT \cdot \ln(n)/Z(80e),$$

where VT is a thermal voltage expressed by (k•T/q), with k being a Boltzmann's factor and q representing an electric charge.

A current following through resistance element 80e is supplied from the external power supply node via MOS transistor 80a, and constant voltage VCST corresponding to current I(80e) appears on the gate of MOS transistor 80a, i.e., node ND40. Resistance element 80e is formed of, e.g., a diffusion resistance, and resistance value Z(80e) of resistance element 80e has a large positive temperature coefficient. The temperature dependency of the thermal voltage of current I(80e) is canceled by the temperature dependency of resistance element 80e, so that constant voltage VCST substantially is held at a constant level independent of the temperature.

Constant current supply 82 includes a P-channel MOS transistor 82a forming a current mirror circuit with MOS transistor 80a of constant voltage generating circuit 80. Therefore, mirror current Icst of current I(80e) flowing through MOS transistor 80a flows through MOS transistor 82a. Current Icst has a temperature dependency substantially compensated for and has no temperature dependency.

Control bits TN[0]-TN[n] selectively turn on/off MOS transistors QQ0-QQn, respectively. Thereby, resistance elements R0-Rn are selectively short-circuited to change a resistance value between resistance element RR and the ground node. Therefore, the amount of voltage drop by constant current Icst supplied from constant current supply 82 changes so that the voltage level of reference voltage VREF produced at node ND43 is adjusted. Reference voltage VREF provided from output node ND43 is expressed by the following equation:

$$VREF = Icst \cdot (R(RR) + m \cdot R(R)) + Vbe,$$

where R(RR) represents a resistance value of resistance element RR, R(R) represents a resistance value of each of resistance elements R0-Rn, m represents the number of the turned-on transistors among transistors QQ0-QQn, and Vbe represents a base-emitter voltage of bipolar transistor 83.

Base-emitter voltage Vbe of bipolar transistor 83 has a negative temperature coefficient, and each of resistance elements R0-Rn is formed of a diffusion resistance, and has a positive temperature coefficient. Therefore, by selectively short-circuiting resistance elements R0-Rn according to control bits TN[0]-TN[n], the temperature dependency of reference voltage VREF can be adjusted in any of the positive and negative directions.

Figure 28:
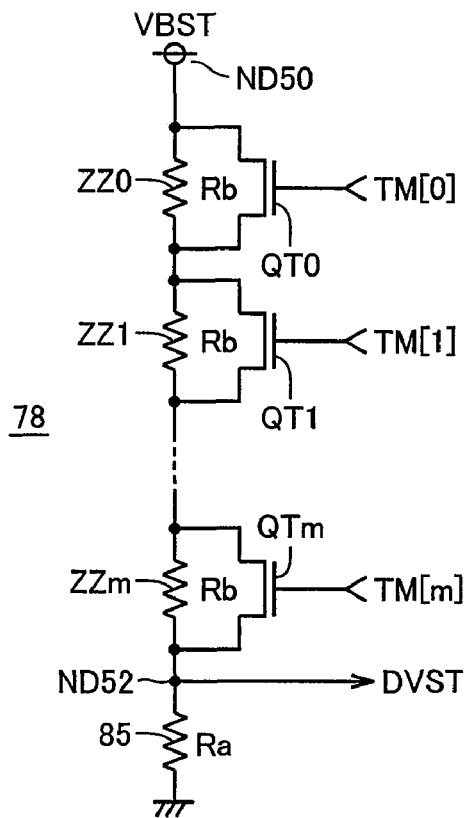
FIG. 28 shows an example of a configuration of a voltage dividing circuit shown in FIG. 26.

FIG. 28 shows an example of a configuration of voltage dividing circuit 78 shown in FIG. 26. In FIG. 28, voltage dividing circuit 78 includes resistance elements ZZ0-ZZm connected in series between a node ND50 receiving verify word line voltage VBST and an output node ND52, a resistance element 85 connected between output node ND52 and the ground node, and N-channel MOS transistors QT0-QTm connected in parallel to resistance elements ZZ0-ZZm and receiving control bits TM[0]-TN[n] on their gates, respectively. Divided voltage DVST is generated at output node ND52.

Resistance elements ZZ0-ZZm and 85 are each formed of, e.g., a diffusion resistance, and a resistance value thereof has a positive temperature coefficient. Resistance elements ZZ0-ZZm have the same resistance value Rb, and resistance element 85 has a resistance value Ra.

In the configuration of voltage dividing circuit 78 shown in FIG. 28, when k such resistance elements are connected between the verify voltage node ND50 and output node ND52, divided voltage DVST is expressed by the following equation:

$$DVST = VBST \cdot Ra/(Ra + k \cdot Rb).$$

Level detecting circuit 74 selectively activates pump enable signal PENF so as for divided voltage DVST to be equal to reference voltage VREF. When resistance elements R0-Rn in VREF generating circuit 72 shown in FIG. 27 are selectively short-circuited for changing the temperature dependency, the voltage level of reference voltage VREF changes. The change in divided voltage DVST compensates for this change in voltage level of reference voltage VREF so that reference voltage VREF, which has different temperature dependency but is at the same voltage level, is produced.

Figure 29:
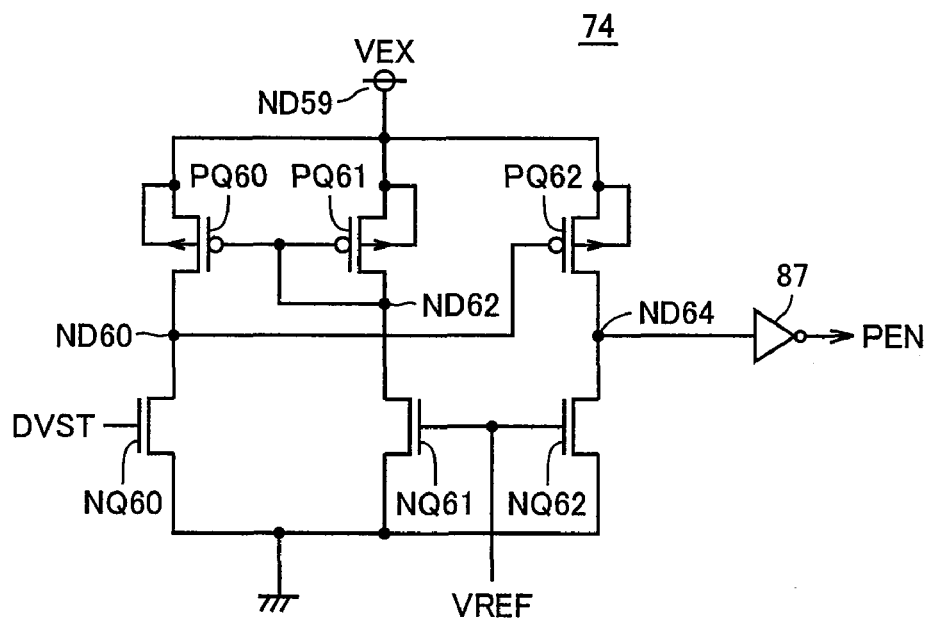
FIG. 29 shows an example of a configuration of a level detecting circuit shown in FIG. 26.

FIG. 29 shows an example of a configuration of level detecting circuit 74 shown in FIG. 26. In FIG. 29, level detecting circuit 74 includes a P-channel MOS transistor PQ60 connected between a power supply node ND59 and an internal node ND60 and having a gate connected to an internal node ND62, a P-channel MOS transistor PQ61 connected between power supply node ND59 and internal node ND62 and having a gate connected to internal node ND62, an N-channel MOS transistor NQ60 connected between internal node ND60 and the ground node and having a gate receiving divided voltage VDST, an N-channel MOS transistor NQ61 connected between internal node ND62 and the ground node and having a gate receiving reference voltage VREF, a P-channel MOS transistor PQ62 connected between power supply node ND59 and a node ND64 and having a gate connected to internal node ND60, an N-channel MOS transistor NQ62 connected between internal node ND64 and the ground node and having a gate receiving reference voltage VREF, and an inverter 87 inverting a voltage signal on node ND64, to produce pump enable signal PEN.

P-channel MOS transistors PQ60-PQ62 have back-gates connected to power supply node ND59. Power supply node ND59 may be supplied with an external power supply voltage VEX, or may be supplied with internal power supply voltage VCC. The level of the voltage supplied to power supply node ND59 is only needed to be determined such that level detecting circuit 74 can perform the detecting operation with the highest sensitivity on the voltage levels of reference voltage VREF and divided voltage DVST.

In the configuration of level detecting circuit 74 shown in FIG. 29, when divided voltage DVST is higher than reference voltage VREF, the voltage level of node ND60 lowers, and the conductance of MOS transistor PQ62 increases so that the current supplied to node ND64 increases. MOS transistor NQ62 functions as a load element to output node ND64, and suppresses rapid change in voltage level of node ND64. In accordance with the rising of the voltage level of node ND64, pump enable signal PEN generated from inverter 87 attains the L level, and the pump operation of pump circuit 76 shown in FIG. 26 stops.

When reference voltage VREF is higher than divided voltage DVST, the voltage level of node ND60 rises, and the conductance of MOS transistor PQ62 lowers so that node ND64 is discharged through MOS transistor NQ62. Responsively, pump enable signal PEN generated from inverter 87 rises to the H level to activate pump circuit 76 shown in FIG. 26. Therefore, level detecting circuit 74 shown in FIG. 29 activates and deactivates pump enable signal PEN to control the pump operation of pump circuit 76 so that reference voltage VREF may become equal to divided voltage DVST.

In this case, word line verify voltage VBST is expressed by the following equation:

$$VBST = DVST \cdot (Ra + k \cdot Rb)/Ra$$
$$= VREF \cdot (Ra + k \cdot Rb)/Ra$$
$$= \{Icst \cdot (R(RR) + m \cdot R(R) + Vbe)\} \cdot (Ra + k \cdot Rb)/Ra.$$

In the above equation, the numerator and denominator in the term of resistance values Ra and Rb cancel the temperature dependency. In the term within curly brackets ("{ }"), base-emitter voltage Vbe has negative temperature characteristics, and resistance value (R(RR)+m•R(R)) has positive temperature characteristics. By adjusting resistance value of (R(RR)+m•R(R)), the temperature characteristics of verify voltage VBST can be changed without changing the voltage level.

Accordingly, verify voltage VBST can be at the voltage level set by control bits TM[n:0], and the temperature characteristics can be set by control bits TN[n: 0], whereby the verification operation can be performed over a wide temperature range through the use of the verify word line voltage, which in turn is produced such that the verify current of the reference cell accurately matches with the drive current of the memory cell. When the verify reference current matches with the cell current at room temperature (voltage VWL1), the voltage level of the verify voltage changes according to its temperature characteristics, to attain the level of voltage VWL2 at the temperature of 100° C., so that the verify reference current matches with the cell current. Therefore, after the voltage level and temperature characteristics of the verify voltage is once set, the threshold voltage distribution (current distribution) is uniform independently of the temperature, and the distribution of the threshold voltage can be constant over a wide temperature range.

Figure 30:
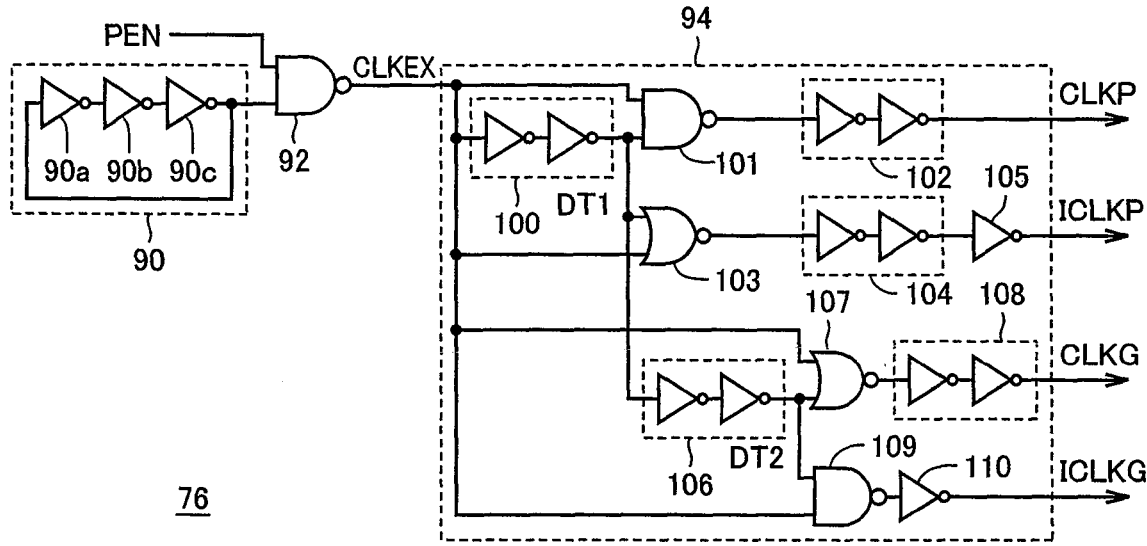
FIG. 30 shows a configuration of a pump control signal generating portion included in a pump circuit shown in FIG. 26.

FIG. 30 shows an example of a configuration of a portion generating a pump control signal included in pump circuit 76 shown in FIG. 26. In FIG. 30, pump circuit 76 includes a clock generating circuit 90 for generating a clock signal, a NAND circuit 92 receiving an output signal of clock generating circuit 90 and pump enable signal PEN, and producing a main pump control signal CLKEX, and a pump control signal generating circuit 94 for producing pump control signals CLKP, CLKG and ICLKG having different-phases, respectively, according to main pump control signal CLKEX.

Clock generating circuit 90 includes an odd number of inverters 90a-90c connected in a ring form. These inverters 90a-90c form a ring oscillator, and produce a clock signal changing in a predetermined cycle.

When pump enable signal PEN is at the H level, NAND circuit 92 operates as an inverter, and inverts the clock signal received from clock generating circuit 90 to change main pump control signal CLKEX. When pump enable signal PEN is set to the L level, NAND circuit 92 fixes main pump control signal CLKEX to the H level regardless of the output signal of clock signal generating circuit 90.

Pump control signal generating circuit 94 includes a delay circuit 100 delaying main pump control signal CLKEX by a predetermined time DT1, a NAND circuit 101 receiving the output signal of delay circuit 100 and main pump control signal CLKEX, a buffer circuit 102 buffering the output signal of NAND circuit 101 to produce pump control signal CLKP, an NOR circuit 103 receiving the output signal of delay circuit 100 and main pump control signal CLKEX, a buffer circuit 104 buffering the output signal of NOR circuit 103, an inverter 105 inverting the output signal of buffer circuit 104 to produce pump control signal ICLKP, a delay circuit 106 further delaying the output signal of delay circuit 100 by a time DT2, an NOR circuit 107 receiving the output signal of delay circuit 106 and main pump control signal CLKEX, a buffer circuit 108 buffering the output signal of NOR circuit 107 to produce pump control signal CLKG, a NAND circuit 109 receiving the output signal of delay circuit 106 and main pump control signal CLKEX, and an inverter 110 inverting the output signal of NAND circuit 109, to produce pump control signal ICLKG.

Each of delay circuits 100 and 106 as well as buffer circuits 102, 104 and 108 is formed of, e.g., two stages of cascaded inverters. Delay circuits 100 and 106 produce the pump control signals having different phases from each other, so that buffer circuits 102, 104 and 108 perform the waveform shaping and fine timing adjustment of the pump control signals.

Figure 31:
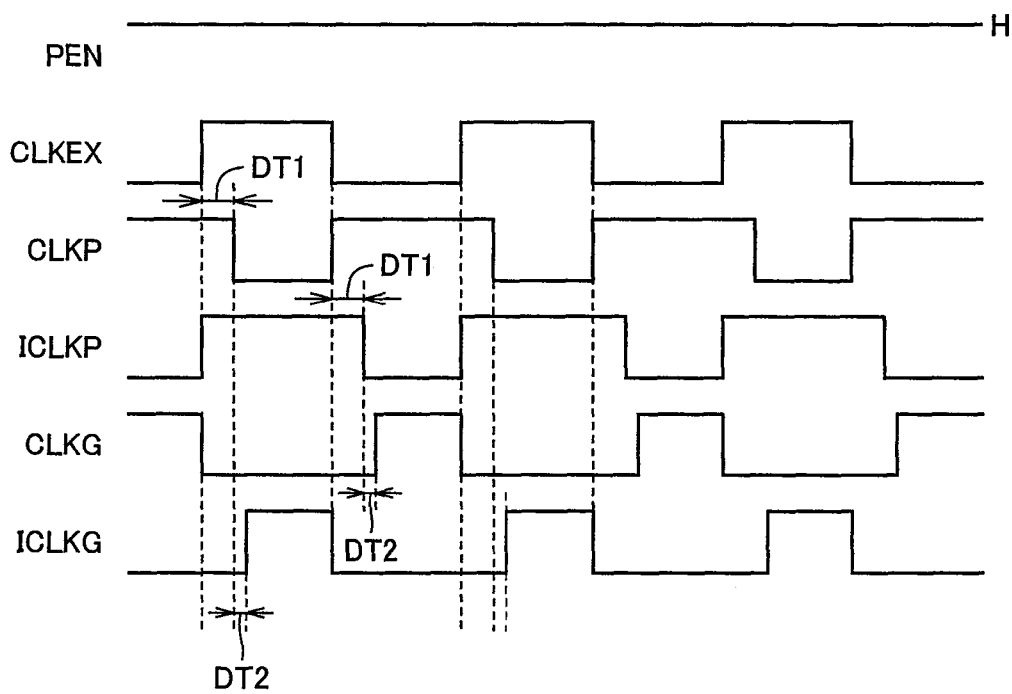
FIG. 31 is a timing chart representing an operation of the pump control signal generating circuit shown in FIG. 30.

FIG. 31 is a timing chart representing an operation of the pump control signal generating circuit shown in FIG. 30. Referring to FIG. 31, description will now be given on an operation performed by pump control signal generating circuit 94 when pump enable signal PEN is at the H level.

When main pump control signal CLKEX rises to the H level, the output signal of NOR circuit 103 attains the L level, and pump control signal ICLKP generated from inverter 105 rises to the H level. Also, the output signal of NOR circuit 107 attains the L level, and the pump control signal CLKG from buffer circuit 108 falls to the L level. Buffer circuits 104 and 108 merely buffers the received signals, and have sufficiently small gate delay times.

When the output signal of delay circuit 100 attains the H level after elapsing of delay time DT1, the output signal of NAND circuit 101 attains the L level, and pump control signal CLKP generated from buffer circuit 102 falls to the L level.

When delay times DT1 and DT2 of delay circuits 100 and 106 elapse, the output signal of NAND circuit 110 attains the L level, and pump control signal ICLKG from inverter 110 rises to the H level.

When main pump control signal CLKEX falls to the L level, the output signal of NAND circuit 101 attains the H level, and responsively, pump control signal CLKP rises to the H level. The output signal of NAND circuit 109 attains the H level, and pump control signal ICLKG generated from inverter 110 falls to the L level.

When delay time DT1 of delay circuit 100 elapses, the output signal of NOR circuit 103 attains the H level, and responsively, pump control signal ICLKP generated from inverter 105 falls to the L level. When delay time DT2 of delay circuit 106 elapses, the output signal of NOR circuit 107 attains the H level, and the pump control signal CLKG generated from buffer circuit 108 rises to the H level.

Subsequently, the same operation will be repeated in response to the rising and falling of main pump control signal CLKEX.

Figure 32:
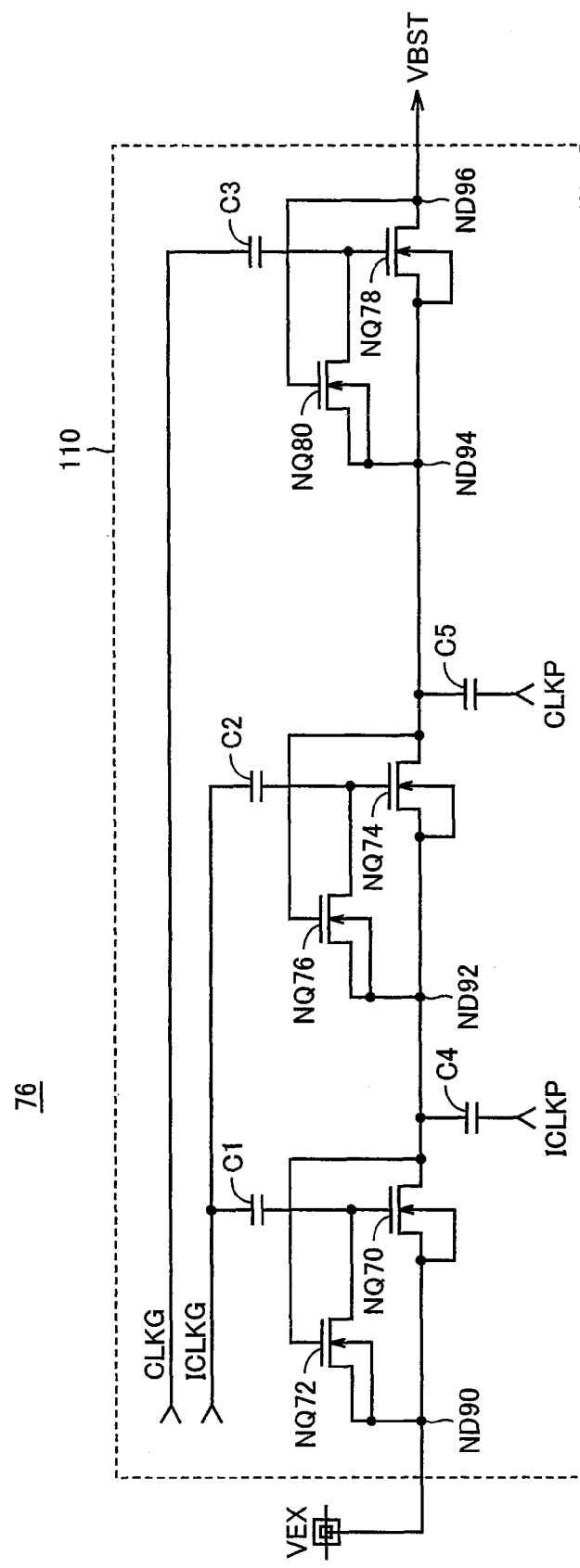
FIG. 32 shows an example of a construction of a boosting pump circuit included in the pump circuit shown in FIG. 26.

FIG. 32 shows an example of a configuration of a boosting pump 115 included in pump circuit 76 shown in FIG. 26. In the example shown in FIG. 32, the boosting pump is formed of three charge transfer stages. More charge transfer stages may be connected.

In FIG. 32, boosting pump 115 included in pump circuit 76 has an N-channel MOS transistor NQ70 connected between an external power supply node ND90 and an internal node ND92 and having a gate receiving pump control signal CLKG via a capacitance element C1, an N-channel MOS transistor NQ72 connected between the gate of MOS transistor NQ70 and external power supply node ND90 and having a gate connected to node ND92, an N-channel MOS transistor NQ74 connected between nodes ND92 and ND94 and having a gate receiving pump control signal ICLKG via a capacitance element C2, an N-channel MOS transistor NQ76 connected between the gate of MOS transistor NQ74 and node ND92 and having a gate connected to node ND94, an N-channel MOS transistor NQ78 connected between node ND94 and an output node ND96 and having a gate receiving pump control signal CLKG via a capacitance element C3, an N-channel MOS transistor NQ80 connected between the gate of MOS transistor NQ78 and node ND94 and having a gate connected to output node ND96, a capacitance element C4 performing a charge pump operation on node ND92 according to pump control signal ICLKP, and a capacitance element C5 performing the charge pump operation on node ND94 according to pump control signal CLKP. Capacitance elements C1 and C4 as well as MOS transistors NQ70 and NQ72 constitute one charge transfer stage. Capacitance elements C2 and C5 as well as MOS transistors NQ74 and NQ76 form one charge transfer stage, and capacitance elements C3 and MOS transistors NQ78 and 80 form a charge transfer stage of a final stage. Word line verify voltage VBST is generated at node ND96.

Figure 33:
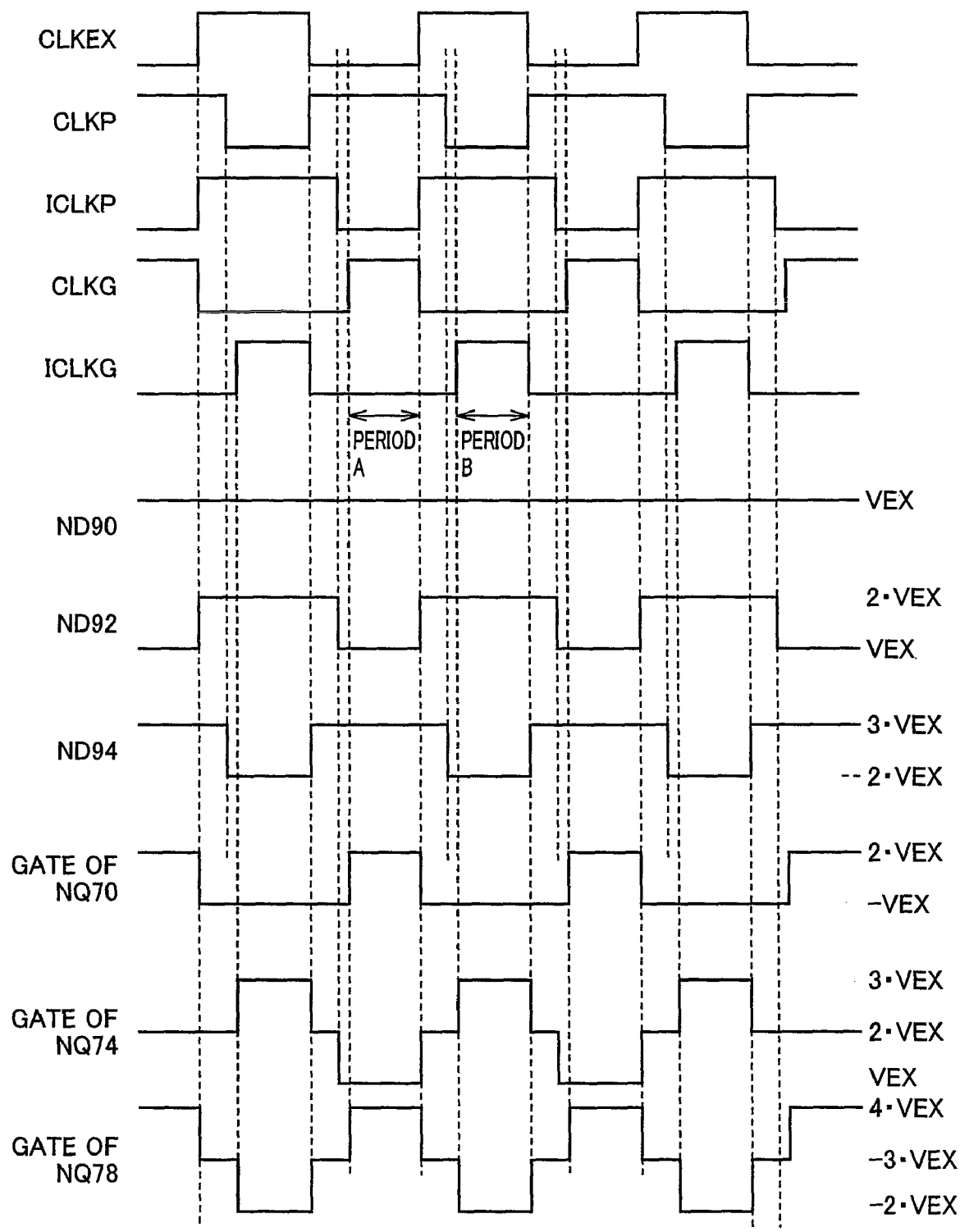
FIG. 33 is a timing chart representing an operation of a boosting pump circuit shown in FIG. 32.

FIG. 33 is a timing chart representing an operation of a boosting pump circuit 110 shown in FIG. 32. Referring to FIG. 33, description will now be given on an operation, which is performed by boosting pump circuit 110 shown in FIG. 32 in a stably operating state.

Node ND90 is kept at the level of external power supply voltage VEX. When pump control signal ICLKP rises in response to main pump control signal CLKEX, the voltage level of node ND92 rises by an amplitude (external power supply voltage VEX) of this pump control signal. Responsively, MOS transistor NQ72 is turned on, and the gate voltage of MOS transistor NQ70 is precharged to the level of external power supply voltage VEX.

At this time instant, pump control signal CLKG falls to the L level, and capacitance elements C1 and C3 perform the charge pump operation. At this time, MOS transistor NQ72 is in an on-state, and the gate potential of MOS transistor NQ70 is kept at the level of external power supply voltage VEX so that MOS transistor NQ70 is kept off. MOS transistor NQ76 is conductive and MOS transistor NQ74 having a gate potential of 3•VEX has a source potential raised through the charge pump operation of capacitance element C4 to be equal to the gate potential thereof, and consequently is rendered nonconductive. Accordingly, node ND92 enters into the floating state, and the charge pump operation of capacitance element C4 reliably precharges node ND92 to the voltage level of 2•VEX.

In response to the falling of pump control signal CLKG, the gate potential of MOS transistor NQ78 falls from voltage 4•VEX to voltage 3•VEX, and MOS transistor NQ78 has the gate and source potentials equal to each other so that MOS transistor NQ78 is turned off In this state, node ND94 has a potential of voltage 3•VEX.

When pump control signal CLKP falls from the H level to the L level, the voltage level of node ND94 drops by the voltage VEX. At this time point, MOS transistor NQ78 has the gate potential already dropped to the level of 3•VEX according to the falling of pump control signal CLKG, and therefore, MOS transistor NQ80 is turned on (output voltage VBST is at the voltage level higher than 2•VEX), to lower the gate potential of MOS transistor NQ78 to 2•VEX in response to the charging operation of capacitance element C5, and MOS transistor NQ78 is reliably kept off.

After pump control signal CLKP rises, pump control signal ICLKG attains the H level, and through charge pump operation of capacitance element C2, MOS transistor NQ74 has the gate potential raised from voltage 2•VEX to voltage 3•VEX, to be turned on. In this state, nodes ND92 and ND94 are at the same voltage level, and MOS transistor NQ76 is kept off.

Then, in response to the falling of main pump control signal CLKEX, pump control signal CLKP rises to the H level, and through charge pump operation of capacitance element C5, node ND94 has a potential level raised from voltage 2•VEX to the level of 3•VEX. According to the potential rising of node ND94, MOS transistor NQ76 is turned on, and the gate of MOS transistor NQ74 is charged to attain the level of 2•VEX equal to that of node ND92.

MOS transistor NQ80 is turned on, and the gate potential of MOS transistor NQ78 attains the voltage of 3•VEX.

At substantially the same timing, pump control signal ICLKG changes from the H level to the L level, and through the charge pump operation of capacitance element C2, MOS transistor NQ74 has the gate potential changed from 3•VEX to 2•VEX, to be turned off.

Then, pump control signal ICLKP falls from the H level to the L level so that through the charge pump operation of capacitance element C4, node ND92 has a potential level dropped to the level of voltage VEX. Responsively, MOS transistor NQ72 is turned off so that MOS transistor NQ70 has the gate potential kept at the level of external power supply voltage VEX, and thus is kept off.

Further, MOS transistor NQ76 is turned on and accordingly, MOS transistor NQ74 has the gate potential further dropped to the level of voltage VEX, to be reliably kept off.

When pump control signal CLKG rises from the L level to the H level, through the charge pump operation of capacitance element C1, MOS transistor NQ70 has the gate potential raised from voltage VEX to voltage 2•VEX to be turned on to transmit external power supply voltage VEX to node ND92. Responsively, node ND92 attains the level of voltage VEX. Through charge pump operation of capacitance element C3, MOS transistor NQ78 has the gate potential raised to 4•VEX, to be turned on to transfer the charges from node ND94 to output node ND96. Accordingly, the potential level of output node ND96 rises. In this operation, the gate potential of MOS transistor NQ74 is already set to the level of voltage VEX, which is equal to the level of the gate potential of node ND92, according to the falling of pump control signal ICLKP, and MOS transistor NQ74 maintains the off state.

Then, pump control signal CLKG falls to the L level in response to the rising of main pump control signal CLKEX. Responsively, by capacitance elements C1 and C3, MOS transistors NQ70 and NQ78 have their respective gate potentials dropped by voltage VEX, to be turned off.

Substantially at the same timing, pump control signal ICLKP rises to the H level, and potential of node ND92 rises so that MOS transistor NQ72 sets the gate potential of MOS transistor NQ70 to the level of external power supply voltage VEX. Accordingly, MOS transistor NQ70 is reliably se to the turned-off state.

MOS transistor NQ76 is currently conductive, to set the gate potential of MOS transistor NQ74 to voltage 2•VEX. In this state, MOS transistor NQ74 still has the gate and source potentials equal to each other, and is kept off.

During this period A, therefore, charges are transferred through MOS transistors NQ70 and NQ78, and positive charges are transferred from node ND90 to node ND92 and from node ND94 to output node ND96.

Then, pump control signal CLKP falls to the L level so that the voltage level of node ND94 drops, and MOS transistor NQ76 is turned off. According to this potential drop at node ND94, MOS transistor NQ80 holds the gate of MOS transistor NQ78 at the voltage level of 3•VEX dropped in response to the last falling of pump control signal CLKG.

When pump control signal ICLKG rises from the L level to the H level, through the charge pump operation of capacitance element C2, MOS transistor NQ74 has the gate potential raised from voltage 2•VEX to voltage 3•VEX, to be turned on to transmit voltage 2•VEX on node ND92 to node ND94, and node ND94 attains the voltage level of 2•VEX. Thereby, node ND94 is reliably precharged to the level of voltage 2•VEX.

Then, pump control signal ICLKG falls to the L level, and pump control signal CLKP attains the H level. Responsively, through the charge pump operation of capacitance element C2, MOS transistor NQ74 has the gate potential set to voltage 2•VEX, and in addition, MOS transistor NQ80 sets the gate potential of MOS transistor NQ78 to the same voltage level of 3•VEX as node ND94.

In this period B, therefore, the charges are internally transferred from node ND92 to node ND94 through MOS transistor NQ74.

By repeating the above operations, the charge transfer form node ND90 to node ND92 and from node ND94 to node ND96 and charge transfer from node ND92 to node ND94 are alternately performed. Thereby, the voltage level of node ND94 changes between the voltages of 2•VEX and 3•VEX, and the maximum voltage of 3•VEX can be produced for the voltage VBST generated at node ND96. If a further higher voltage is required, the charge transfer stages alternately performing the charge transfer are increased in number.

By selectively activating the pump operation of boosting pump circuit 110 according to the pump control signal, word line verify voltage VBST can be set to a predetermined voltage level or a level of reference voltage VREF.

The verify voltages for the respective data of the multi-level data may be set to the same level, and the verify reference cell or the verify reference current may be changed according to each data for performing the verification operation. Alternatively, with the verify reference current level kept unchanged, the verify voltage levels may be changed according to the respective data for performing the verification operation. This embodiment may be combined with the fourth embodiment.

According to the sixth embodiment of the invention, as described heretofore, the word line verify voltage used in the verification operation is not changed in absolute value, but is made temperature-dependent. Thus, even when the memory cell and the reference cell are different in operating characteristics, the memory cell current can be matched with the reference cell current while compensating for the temperature dependency in the relation between the drive current and the gate voltage of the memory cell and the reference cell, and accordingly, the threshold voltage distribution can be adjusted.

The invention can be applied to any nonvolatile semiconductor memory device storing binary or more data, and contains a read circuit of the current sense type for differentially amplifying the drive circuits of a reference cell and a memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   memory cells arranged at least in one row, each memory cell including a transistor having a gate and exhibiting gate-voltage to drive-current characteristics having temperature dependency, and said each storing data according to a threshold voltage of the transistor;
   voltage generating circuitry for generating a word line drive voltage having temperature dependency for compensating for the temperature dependency of the gate-voltage to drive-current characteristics of the transistors of said memory cells, said word line drive voltage having the temperature dependency changeable both in a positive direction and in a negative direction according to a control signal;
   at least one word line arranged corresponding to the memory cells arranged in the row, and connected to the gates of the memory cell transistors; and
   word line select circuitry for transmitting the word line drive voltage generated by said voltage generating circuit to said one word line when said one word line is selected,
   wherein said voltage generating circuitry includes:
   a voltage producing circuit for producing said word line drive voltage through a charge pump operation when made active,
   a voltage dividing circuit for dividing the word line drive voltage produced by said voltage producing circuit,
   a reference voltage generating circuit for generating a reference voltage having a temperature dependency,
   a control circuit for adjusting the temperature dependency of the reference voltage produced by said reference voltage generating circuit, and adjusting a voltage-division ratio of said voltage dividing circuit, and
   a level determining circuit for selectively activating said voltage producing circuit based on a comparison between the reference voltage generated from said reference voltage generating circuit and a divided voltage generated from said voltage dividing circuit.

2. The semiconductor memory device according to claim 1, wherein said reference voltage generating circuit includes:
   a constant current generating circuit generating a constant current,
   a diode-connected bipolar transistor, and
   a resistance element having a variable resistance value, and supplying the constant current supplied from said constant current generating circuit to the bipolar transistor, said reference voltage being produced on a node between said constant current generating circuit and said resistance element.

* * * * *